US012494467B2

(12) United States Patent
Lee et al.

(10) Patent No.: US 12,494,467 B2
(45) Date of Patent: Dec. 9, 2025

(54) DISPLAY DEVICE AND METHOD OF FABRICATING THE SAME

(71) Applicant: Samsung Display Co., LTD., Yongin-si (KR)

(72) Inventors: Jong Chan Lee, Suwon-si (KR); Sang Jun Park, Daegu (KR); Jeong Hyun Lee, Anyang-si (KR); Woong Hee Jeong, Seoul (KR); Kwang Taek Hong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/412,152

(22) Filed: Jan. 12, 2024

(65) Prior Publication Data

US 2024/0153935 A1    May 9, 2024

Related U.S. Application Data

(62) Division of application No. 17/203,496, filed on Mar. 16, 2021, now Pat. No. 11,908,848.

(30) Foreign Application Priority Data

Jun. 3, 2020    (KR) ........................ 10-2020-0066903

(51) Int. Cl.
*H01L 25/16*    (2023.01)
*H01L 25/075*    (2006.01)
(Continued)

(52) U.S. Cl.
CPC ........ *H01L 25/167* (2013.01); *H01L 25/0753* (2013.01); *H10H 20/857* (2025.01); *H10H 20/0364* (2025.01)

(58) Field of Classification Search
None
See application file for complete search history.

(56) References Cited

U.S. PATENT DOCUMENTS 10,038,037 B2    7/2018    Choung et al.
11,152,424 B2   10/2021    Li et al.
(Continued)

FOREIGN PATENT DOCUMENTS

KR    20170028497       3/2017
KR    20190124359 A    11/2019
(Continued)

OTHER PUBLICATIONS

Translation of WO 2019208880 A1 (Year: 2019).*

*Primary Examiner* — Sue A Purvis
*Assistant Examiner* — Carnell Hunter, III
(74) *Attorney, Agent, or Firm* — Womble Bond Dickinson (US) LLP

(57) ABSTRACT

A display device and a method of fabricating a display device are provided. The display device includes a substrate comprising a contact area and a line area, a first electrode that extends in a first direction on the substrate, a first electrode pattern that extends in the first direction and is spaced apart from the first electrode on the substrate, a second electrode that extends in the first direction and is between the first electrode and the first electrode pattern on the substrate, a second electrode pattern that extends in the first direction and is between the first electrode and the second electrode on the substrate, and a first light-emitting element between the first electrode and the second electrode pattern in the contact area.

4 Claims, 25 Drawing Sheets

(51) Int. Cl.
  *H10H 20/857* (2025.01)
  *H10H 20/01* (2025.01)

(56) References Cited

U.S. PATENT DOCUMENTS

| | | | |
|---|---|---|---|
| 11,367,823 | B2 | 6/2022 | Kim et al. |
| 11,811,012 | B2 | 11/2023 | Kim et al. |
| 11,888,092 | B2 | 1/2024 | Jung et al. |
| 12,261,245 | B2 | 3/2025 | Jung et al. |
| 2014/0206117 | A1* | 7/2014 | Sonoda ............ H05B 33/28 |
| | | | 438/29 |
| 2017/0069695 | A1 | 3/2017 | Choung et al. |
| 2021/0242380 | A1* | 8/2021 | Kim ............ H01L 33/0095 |
| 2021/0242381 | A1 | 8/2021 | Lee et al. |
| 2022/0037397 | A1 | 2/2022 | Li et al. |
| 2024/0063359 | A1 | 2/2024 | Kim et al. |

FOREIGN PATENT DOCUMENTS

| | | | |
|---|---|---|---|
| KR | 10-2020-0013190 A | | 2/2020 |
| KR | 20200014955 A | | 2/2020 |
| KR | 10-2020-0037911 A | | 4/2020 |
| KR | 20200040959 A | | 4/2020 |
| KR | 10-2021-0098313 A | | 8/2021 |
| WO | WO-2019208880 A1 * | 10/2019 | ......... H01L 25/0753 |

* cited by examiner

610 : 611,612,620

DISPLAY DEVICE AND METHOD OF FABRICATING THE SAME

CROSS-REFERENCE TO RELATED APPLICATION

This application is a divisional of U.S. patent application Ser. No. 17/203,496, filed Mar. 16, 2021, which claims priority to and the benefit of Korean Patent Application No. 10-2020-0066903, filed on Jun. 3, 2020 in the Korean Intellectual Property Office, the entire content of which is hereby incorporated by reference.

BACKGROUND

1. Field

Embodiments of the present disclosure relate to a display device and a method of fabricating the same.

2. Description of the Related Art

Display devices have become more and more important as multimedia technology has evolved. Accordingly, a variety of types (or kinds) of display devices such as, for example, organic light-emitting display (OLED) devices and liquid-crystal display (LCD) devices are currently used.

Display devices are for displaying images and include a display panel such as, for example, an organic light-emitting display panel and/or a liquid-crystal display panel. Among them, the light-emitting display panel may include light-emitting elements. For example, light-emitting diodes (LEDs) may include an organic light-emitting diode (OLED) using an organic material as a fluorescent material, and an inorganic light-emitting diode using an inorganic material as a fluorescent material.

SUMMARY

Aspects of embodiments of the present disclosure provide a display device capable of increasing transmittance of light generated by and emitted from a light-emitting element to thereby improve brightness.

Aspects of embodiments of the present disclosure also provide a display device capable of reducing resistance of lines by providing a plurality of conductive layers in a line area that transmits electric signals.

Aspects of embodiments of the present disclosure also provide a method of fabricating a display device that can prevent or reduce damage to a contact electrode by an etchant during an etching process for forming a first pattern including the same (e.g., substantially the same) material as the contact electrode.

It should be noted that features of the present disclosure are not limited to the above-mentioned features; and other features of the present disclosure will be apparent to those skilled in the art from the following descriptions.

According to an embodiment of the present disclosure, a display device includes a substrate including a contact area and a line area, a first electrode on the substrate and that extends in a first direction, a first electrode pattern spaced apart from the first electrode on the substrate and that extends in the first direction, a second electrode between the first electrode and the first electrode pattern on the substrate and that extends in the first direction, a second electrode pattern between the first electrode and the second electrode on the substrate and that extends in the first direction, a first light-emitting element between the first electrode and the second electrode pattern in the contact area, a first contact electrode on the first electrode in the contact area and in contact (e.g., physical contact) with a first end of the first light-emitting element, a second contact electrode comprising a first area and a second area, wherein the first area is on the second electrode pattern in the contact area and is in contact (e.g., physical contact) with a second end of the first light-emitting element, and wherein the second area extends from the first area and is in the line area, and a first pattern on the second area in the line area.

In an exemplary embodiment, the first pattern is in physical contact with the second area.

In an exemplary embodiment, the first pattern comprises a same (e.g., substantially the same) material as the first contact electrode.

In an exemplary embodiment, the display device includes a second light-emitting element between the second electrode and the first electrode pattern in the contact area.

In an exemplary embodiment, the display device includes a third contact electrode on the second electrode in the contact area and in contact with a first end of the second light-emitting element, wherein the second contact electrode further comprises a third area that extends from the second area to be on the first electrode pattern in the contact area, and in contact (e.g., physical contact) with a second end of the second light-emitting element.

In an exemplary embodiment, the third contact electrode includes a same (e.g., substantially the same) material as the first contact electrode.

In an exemplary embodiment, the display device includes an insulating layer on the second contact electrode, wherein the insulating layer exposes at least a part of the second area in the line area, and covers the first area in the contact area.

In an exemplary embodiment, the first pattern is in physical contact with the second area exposed by the insulating layer.

In an exemplary embodiment, an upper surface of the second area is in direct contact (e.g., physical contact) with a lower surface of the first pattern.

In an exemplary embodiment, the display device includes an insulating layer on the second contact electrode, wherein the insulating layer is between the second area and the first pattern in the line area, and includes a plurality of contact holes that penetrate through the insulating layer to expose a part of the second area.

In an exemplary embodiment, the first pattern is in direct contact (e.g., physical contact) with the second area through the plurality of contact holes that penetrate through the insulating layer.

In an exemplary embodiment, a thickness of the first contact electrode, a thickness of the second contact electrode and a thickness of the first pattern are each in a range of 150 Å to 1,000 Å.

According to another exemplary embodiment of the disclosure, a display device includes a substrate, an electrode layer on the substrate and including a first electrode, a first electrode pattern spaced apart from the first electrode, a second electrode between the first electrode and the first electrode pattern, and a second electrode pattern between the first electrode and the second electrode, a plurality of light-emitting elements on the electrode layer and including a first light-emitting element and a second light-emitting element, wherein both ends of the first light-emitting element are on the first electrode and the second electrode pattern, respectively, wherein both ends of the second light-emitting element are on the second electrode and the first electrode pattern, respectively, a first contact electrode on the first electrode to overlap the first electrode and in contact (e.g., physical contact) with a first end of the first light-emitting element, a second contact electrode on the second electrode to overlap the second electrode and in contact (e.g., physical contact) with a first end of the second light-emitting element, a third contact electrode on the electrode layer and including a first area, a second area and a third area, wherein the first area overlaps the second electrode pattern and is in contact (e.g., physical contact) with a second end of the first light-emitting element, the second area overlaps the first electrode pattern and is in contact (e.g., physical contact) with a second end of the second light-emitting element, and the third area connects couples the first area with the second area, an insulating layer on the third contact electrode, and a first pattern on the third area.

In an exemplary embodiment, the insulating layer covers the first area and the second area and exposes at least a part of the third area.

In an exemplary embodiment, the first pattern is in physical contact with the third area exposed by the insulating layer.

In an exemplary embodiment, the third contact electrode includes crystalline ITO, and wherein the first pattern includes crystalline ITO and/or amorphous ITO.

According to another exemplary embodiment of the disclosure, a method of fabricating a display device includes forming an electrode layer including a first electrode layer and a second electrode spaced apart from each other on a target substrate including a line area and a contact area, and providing a plurality of light-emitting elements between the first electrode layer and the second electrode layer in the contact area, forming a contact electrode material pattern on the electrode layer, forming a contact electrode by carrying out heat treatment on the contact electrode material pattern, and forming a first pattern on the contact electrode in the line area.

In an exemplary embodiment, the forming the contact electrode includes forming the contact electrode including crystalline ITO by carrying out heat treatment on the contact electrode material pattern including amorphous ITO, and wherein the heat treatment is carried out at a temperature in a range of 200° C. to 270° C. for 10 to 20 minutes.

In an exemplary embodiment, the method includes forming an insulating layer on the contact electrode prior to the forming the first pattern, wherein the insulating layer exposes at least a part of the contact electrode in the line area, and wherein the first pattern is on the contact electrode exposed by the insulating layer.

In an exemplary embodiment, the first electrode layer includes a first electrode and a first electrode pattern spaced apart from the first electrode, wherein the second electrode layer includes a second electrode between the first electrode and the first electrode pattern, and a second electrode pattern between the first electrode and the second electrode, wherein the contact electrode includes a first area on the second electrode pattern in the contact area, a second area on the first electrode pattern in the contact area, and a third area between the first area and the second area in the line area, and wherein the first pattern is on the third area.

According to an exemplary embodiment of the present disclosure, a display device may include a plurality of light-emitting elements, first to third contact electrodes, and a first pattern. The display device may include a contact area in which the plurality of light-emitting elements and first to third contact electrodes are in contact (e.g., physical contact) with one another, and a line area in which the plurality of light-emitting elements and the first to third contact electrodes are not in contact with one another. In the contact area, the first to third contact electrodes may be spaced apart from one another, and in the line area, the third contact electrode and the first pattern may overlap each other and may be in direct contact (e.g., physical contact) with each other. Therefore, the thickness of a conductive layer that transmits electric signals in the line area (e.g., the third contact electrode and the first pattern) may be larger than the thickness of a conductive layer in contact (e.g., physical contact) with the light-emitting elements (e.g., the conductive layer forming the first to third contact electrode), and thus, the lines can have a lower resistance in the line area. Accordingly, the transmittance of the light generated and emitted by the light-emitting elements can be improved in the contact area to increase the brightness of the display device in the contact area, and the resistance of the lines can be reduced in the line area that transmits electric signals.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects and features of embodiments of the present disclosure will become more apparent by describing in more detail exemplary embodiments thereof with reference to the attached drawings, in which.

DETAILED DESCRIPTION

The subject matter of the present disclosure will now be described more fully hereinafter with reference to the accompanying drawings, in which example embodiments of the present disclosure are shown. The subject matter of this disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present.

The same reference numbers indicate the same components throughout the specification. In the attached figures, the thickness of layers and regions may be exaggerated for clarity.

Hereinafter, exemplary embodiments of the present disclosure will be described with reference to the accompanying drawings.

Figure 1:
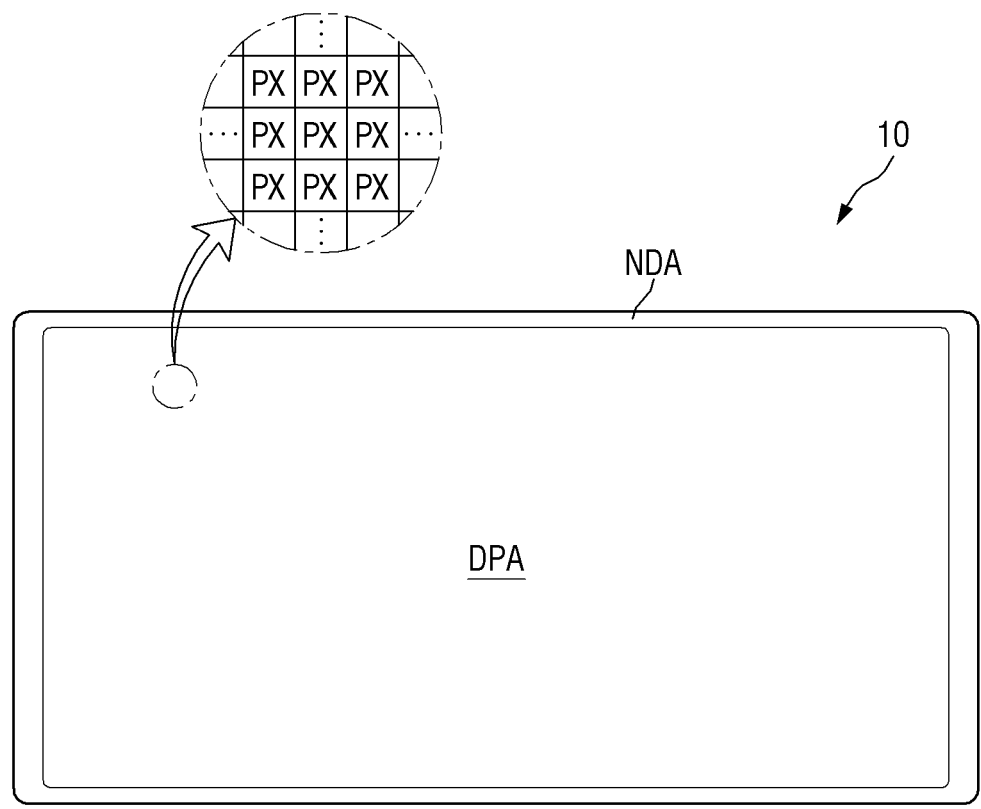
FIG. 1 is a plan view of a display device according to an exemplary embodiment of the present disclosure.

FIG. 1 is a plan view of a display device according to an exemplary embodiment of the present disclosure.

Referring to FIG. 1, a display device 10 displays a moving image or a still image. The display device 10 may refer to any suitable electronic device that provides a display screen. For example, the display device 10 may include a television set, a laptop computer, a monitor, an electronic billboard, the Internet of Things devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console, a digital camera, a camcorder, etc.

The display device 10 includes a display panel for providing a display screen. Examples of the display panel may include an inorganic light-emitting diode display panel, an organic light-emitting display panel, a quantum-dot light-emitting display panel, a plasma display panel, a field emission display panel, etc. In the following description, an inorganic light-emitting diode display panel is employed as an example of the display panel 10, but the present disclosure is not limited thereto. Any other suitable display panel may be employed as long as the technical idea of the present disclosure can be equally applied.

In the drawings, a first direction DR1, a second direction DR2, and a third direction DR3 are defined. The first direction DR1 may be perpendicular (e.g., substantially perpendicular) to the second direction DR2 in a plane. The third direction DR3 may be perpendicular (e.g., substantially perpendicular) to the plane where the first direction DR1 and the second direction DR2 are located. The third direction DR3 may be perpendicular (e.g., substantially perpendicular) to each of the first direction DR1 and the second direction DR2. In the following description of the display devices 10 according to the exemplary embodiments of the present disclosure, the third direction DR3 refers to a thickness direction of the display device 10.

The display device 10 may have a rectangular shape including longer sides in the first direction DR1 and shorter sides in the second direction DR2 when viewed from the top, but the present disclosure is not limited thereto. Although the corners where the longer sides and the shorter sides of the display device 10 meet may form a right angle, this is merely illustrative. For example, the display device 1 may have rounded corners. The shape of the display device 10 is not limited to that shown but may be modified in a variety of ways. For example, the display device 10 may have other shapes such as a square, a rectangle with rounded corners (vertices), other polygons and a circle.

A display surface may be located on one side of the display device 10 in the third direction DR3, e.g., the thickness direction. In the following description, the upper portion of the display device 10 refers to a side in the third direction DR3 where images are displayed, and likewise the upper surface of the display device 10 refers to a surface facing the side in the third direction DR3, unless specifically stated otherwise. In addition, the lower portion refers to the opposite side in the third direction DR3, and likewise the lower surface refers to a surface facing the opposite side in the third direction DR3. As used herein, the terms "left," "right," "upper," and "lower" sides refer to relative positions when the display device 10 is viewed from the top. For example, the right side refers to one side in the first direction DR1, the left side refers to the other side in the first direction DR1, the upper side refers to one side in the second direction DR2, and the lower side refers to the other side in the second direction DR2.

The display device 10 may include the display area DPA and a non-display area NDA. In the display area DPA, images can be displayed. In the non-display areas NDA, images are not displayed. The display area DPA may be referred to as an active area, while the non-display areas NDA may also be referred to as an inactive area.

The shape of the display area DPA may follow the shape of the display device 10. For example, the shape of the display area DPA may have a rectangular shape generally similar to the shape of the display device 10 when viewed from the top. The display area DPA may generally occupy the center of the display device 10.

The display area DPA may include a plurality of pixels PX. The plurality of pixels PX may be arranged in a matrix. The shape of each of the pixels PX may be rectangular or square when viewed from the top. It is, however, to be understood that the present disclosure is not limited thereto. For example, the shape of each of the pixels PX may have a diamond shape having the sides inclined with respect to one direction. The pixels PX may be arranged in stripes and PENTILE® pattern alternately (PENTILE® is a registered trademark of Samsung Display Co., Ltd.).

The non-display areas NDA may be around the display area DPA. The non-display areas NDA may surround the display area DPA either entirely or partially. According to an exemplary embodiment of the present disclosure, the display area DPA may have a rectangular shape, and the non-display areas NDA may be adjacent to the four sides of the display area DPA. The non-display area NDA may form the bezel of the display device 10. Lines and/or circuit drivers included in the display device 10, or pad areas on which external devices are mounted may be in the non-display areas NDA.

Figure 2:
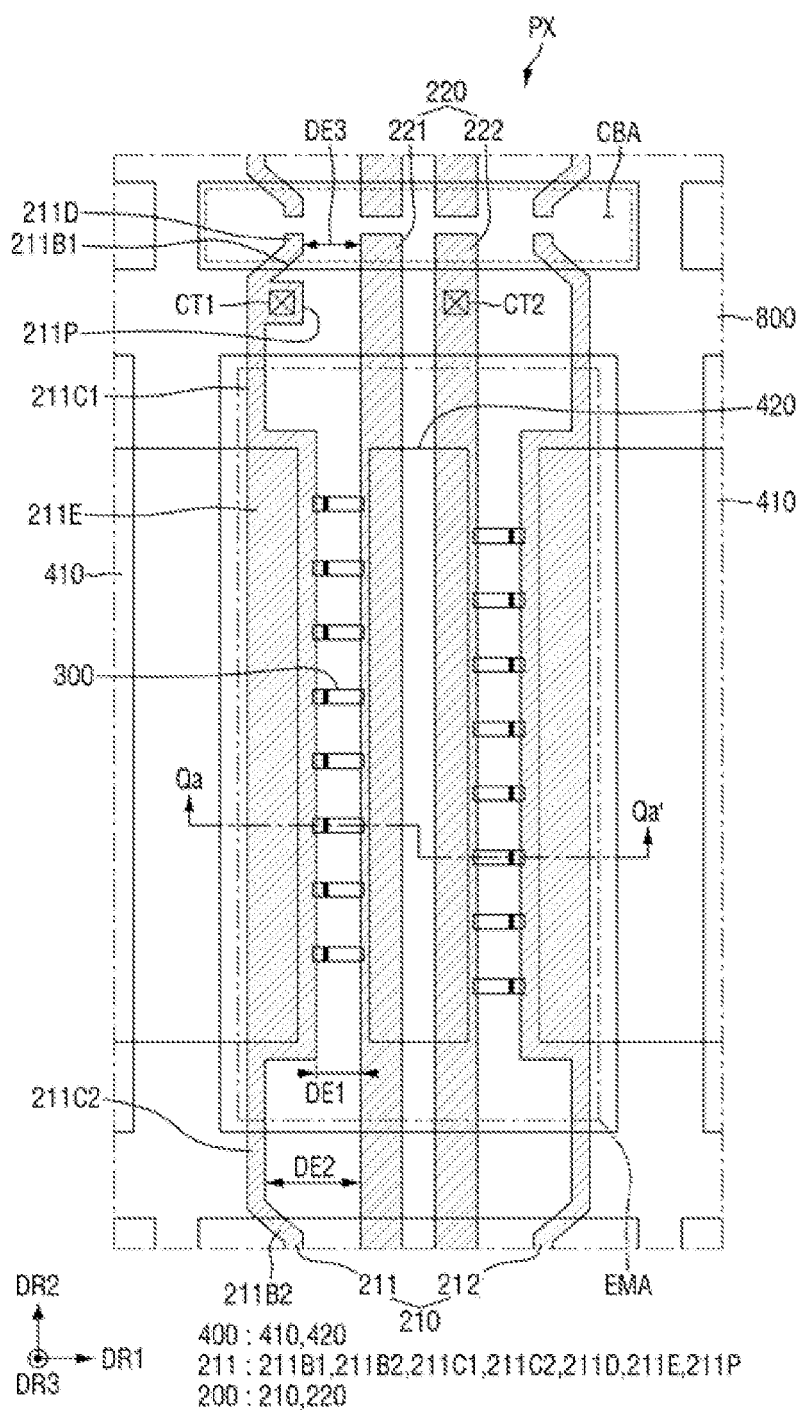
FIG. 2 is a plan view of a layout showing relative position relationship between an electrode layer and a plurality of banks in a pixel.
Figure 3:
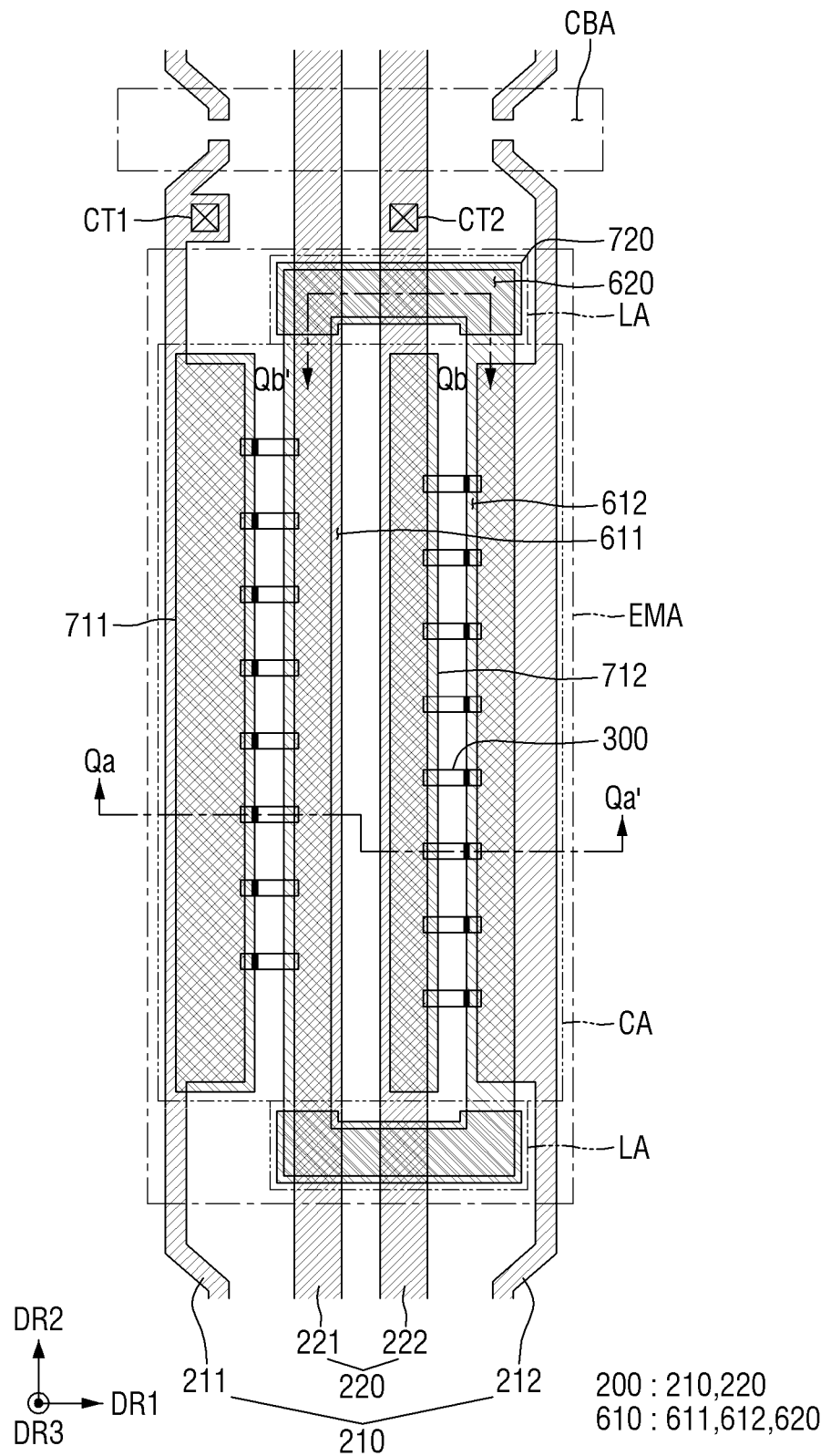
FIG. 3 is a plan view showing a layout for illustrating relative position relationships of an electrode layer, first to third contact electrodes, and a first pattern in a pixel.
Figure 4:
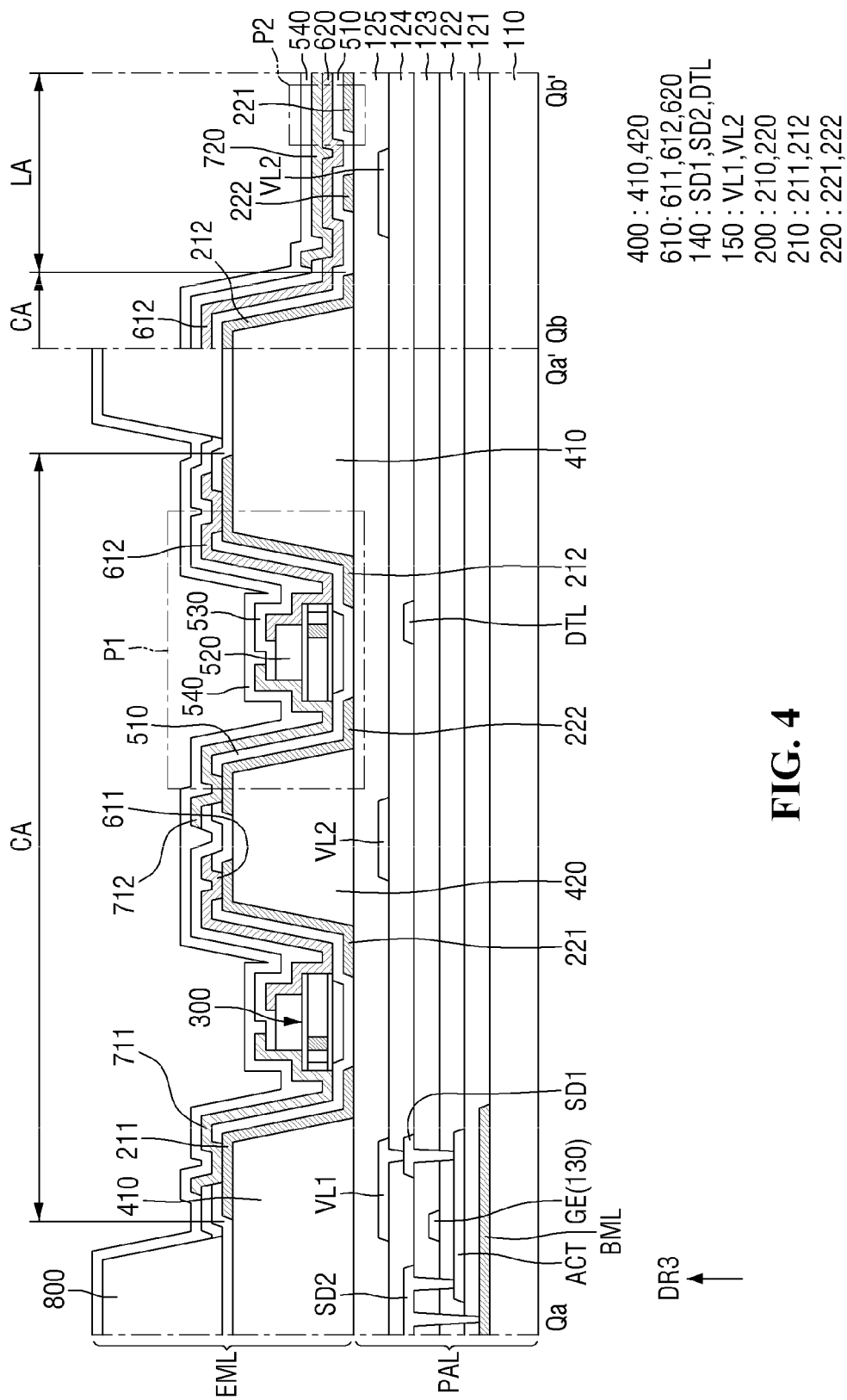
FIG. 4 is a cross-sectional view showing an example of a display device, taken along lines Qa-Qa' and Qb-Qb' of FIGS. 2 and 3.

FIG. 2 is a plan view of a layout showing relative position relationships between an electrode layer and a plurality of banks in a pixel. FIG. 3 is a plan view of a layout showing relative position relationships between an electrode layer and a contact electrode layer in a pixel. FIG. 4 is a cross-sectional view of a display device, taken along lines Qa-Qa' and Qb-Qb' of FIG. 3.

Referring to FIGS. 2 and 3, one pixel PX of the display device 10 may include an emission area EMA and a non-emission area. In the emission area EMA, light of a set or specific wavelength band is emitted from light-emitting elements 300 to be further described herein below. In the non-emission area, no light is emitted (e.g., the non-emission area is not designed to emit light). The non-emission area may include a cut area CBA.

The emission area EMA may be at the central portion of one pixel PX when viewed from the top. The pixel PX of the display device 10 may include a plurality of light-emitting elements 300, which are further described herein below. The emission area EMA may include an area in which the light-emitting elements 300 are included, and may include areas around the light-emitting elements 300 where light emitted from the light-emitting elements 300 exits. The emission area EMA may further include an area in which light emitted from the light-emitting elements 300 is reflected or refracted by another element and exits in the display direction DR3 of the display device 10. For example, the plurality of light-emitting elements 300 may be in each of the pixels PX, and the emission area may include the area where the light-emitting elements are included and the adjacent areas.

The emission area EMA may include a contact area CA and line areas LA.

The contact area CA may be at a central portion of the emission area EMA when viewed from the top. In the contact area CA, the light-emitting elements 300 and contact electrodes 610, 711, and 712 to be further described herein below are in contact (e.g., physical contact) with one another. In the contact area CA, the light-emitting elements 300 and the contact electrodes 610, 711, and 712 may be included. In the contact area CA, the ends of the light-emitting elements 300 may be in contact (e.g., physical contact) with the contact electrodes 610, 711, and 712. Further description thereof will be provided herein below.

The line areas LA may be respectively on the upper side of the contact area CA (e.g., on one side in the second direction DR2) and on the lower side of the contact area CA (e.g., on the other side in the second direction DR2) when viewed from the top. In the line area LA, a third area 620 of the third contact electrode 610 and the first pattern 720 overlap each other in the third direction DR3. In addition, in the line area LA, lines may be arranged, to which electric signals from the first electrode 211 further described herein below are transmitted through the light-emitting elements 300, the third area 620 of the third contact electrode 610, and the first pattern 720.

The light-emitting elements 300 are not included in the non-emission area and light emitted from the light-emitting elements 300 do not reach the non-emission area, and thus, no (or substantially no) light exits therefrom.

The cut area CBA may be on the upper side of the emission area EMA (e.g., one side in the second direction DR2) when viewed from the top. The cut area CBA may be between the emission areas EMA of neighboring pixels PX in the second direction DR2. The length of the cut area CBA in the first direction DR1 may be larger than the length of the emission area EMA in the first direction DR1. The length of the cut area CBA in the second direction DR2 may be smaller than the length of the emission area EMA in the second direction DR2. It is, however, to be understood that the present disclosure is not limited thereto. The cut area CBA may have different shape and size when viewed from the top depending on the shape of a second bank 800 to be further described herein below.

In the display area DPA of the display device 10, a plurality of emission areas EMA and a plurality of cut areas CBA may be arranged. For example, the plurality of emission areas EMA and the plurality of cut areas CBA may be arranged repeatedly in the first direction DR1, and may be arranged alternately in the second direction DR2.

In the cut area CBA, electrode layers 210 and 220 included in adjacent pixels PX in the second direction DR2 may be separated from each other. A part of each of the electrode layers 210 and 220 in each of the pixels PX may be in the cut area CBA. The electrode layers 210 and 220 of a pixel PX may be separated from those of another pixel PX adjacent to the pixel PX in the second direction DR2 in the cut area CBA.

Referring to FIGS. 2 and 4, the display device 10 may include a circuit element layer PAL and an emission material layer EML on the circuit element layer PAL. The circuit element layer PAL may include a substrate 110, a buffer layer 121 on the substrate 110, a semiconductor layer, a plurality of conductive layers, a plurality of insulating layers, and a via layer 125. The emission material layer EML may be is on the via layer 125 of the circuit element layer PAL, and may include electrode layers 200, the plurality of light-emitting elements 300, the first contact electrode 711, the second contact electrode 712, the third contact electrode 610, a first pattern 720, a plurality of insulating layers, a first bank 400, a second bank 800, etc.

Hereinafter, a plurality of layers of the circuit element layer PAL in one pixel PX of the display device 10 will be further described with reference to FIG. 4.

The pixel PX of the display device 10 may include a plurality of transistors. Although only one first transistor among a plurality of transistors included in the pixel PX of the display device 10 is depicted in the drawings, the present disclosure is not limited thereto. For example, the display device 10 may include two or three transistors in each of the pixels PX.

The substrate 110 may be an insulation substrate. The substrate 110 may be made of an insulating material such as glass, quartz and a polymer resin. The substrate 110 may be either a rigid substrate or a flexible substrate that can be bent, folded, or rolled.

A bottom metal layer BML may be on the substrate 110. The bottom metal layer BML may be a light-blocking layer that protects an active layer ACT of the semiconductor layer from external light. The bottom metal layer BML may include a material that blocks light (or reduces transmission of light). For example, the bottom metal layer BML may be made of an opaque metal material that blocks (or reduces) light transmission.

The bottom metal layer BML may have a patterned shape. The bottom metal layer BML may be under and may cover at least a channel region of the active layer ACT of the transistor of the display device 10, and may further cover the entire active layer ACT of the transistor. It is, however, to be understood that the present disclosure is not limited thereto. The bottom metal layer BML may be eliminated.

The buffer layer 121 may be on the bottom metal layer BML. The buffer layer 121 may cover the entire surface of the substrate 110 on which the bottom metal layer BML is included. The buffer layer 121 can protect the transistor from permeation of moisture through the substrate 110, which is vulnerable to moisture permeation. The buffer layer 121 may include inorganic materials such as silicon oxide (SiOx), silicon nitride (SiNx), and/or silicon oxynitride (SiON). Without being limited thereto, the buffer layer 121 may be made up of a plurality of inorganic layers stacked on one another alternately.

The semiconductor layer may be on the buffer layer 121. The semiconductor layer may include the active layer ACT of the transistor. The active layer ACT may overlap the bottom metal layer BML.

The semiconductor layer may include polycrystalline silicon, an oxide semiconductor, etc. According to an exemplary embodiment of the present disclosure, when the semiconductor layer includes polycrystalline silicon, the semiconductor layer may be formed by crystallizing amorphous silicon. According to another exemplary embodiment, when the semiconductor layer includes an oxide semiconductor, the oxide semiconductor may include, for example, indium-tin oxide (ITO), indium-zinc oxide (Indium-Zinc Oxide, IZO), Indium-Gallium Oxide (IGO), indium-zinc-tin oxide (IZTO), indium-gallium-zinc oxide (IGZO), indium-gallium-tin oxide (IGTO), indium-gallium-zinc oxide (IGZO), and/or indium-gallium-zinc-tin Oxide (IGZTO).

The gate insulating layer 122 may be over the active layer ACT. The gate insulating layer 122 may be on the buffer layer 121 on which the active layer ACT is included. The gate insulating layer 122 may work as a gate insulator of the transistor. The gate insulator 122 may be made up of an inorganic layer including an inorganic material such as silicon oxide (SiOx), silicon nitride (SiNx), and/or silicon oxynitride (SiON), or may be formed of a stack of such materials.

A gate conductive layer 130 may be on the gate insulator 122. The gate conductive layer 130 may include a gate electrode GE of the transistor. The gate electrode GE may be provided such that it overlaps the channel region of the active layer ACT1 in the thickness direction. The gate conductive layer 130 may further include a first electrode of a storage capacitor.

The gate conductive layer 130 may include at least one selected from molybdenum (Mo), aluminum (Al), chromium (Cr), gold (Au), titanium (Ti), nickel (Ni), neodymium (Nd), and copper (Cu). The gate conductive layer 130 may be made up of a single layer or a plurality of layers.

The interlayer dielectric layer 123 is on the gate conductive layer 130. The interlayer dielectric layer 123 may be on the gate insulator 122 on which the gate conductive layer 130 is formed. The interlayer dielectric layer 123 may include inorganic insulating materials such as silicon oxide (SiOx), silicon nitride (SiNx), and/or silicon oxynitride (SiON).

A first data conductive layer 140 is on the interlayer dielectric layer 123. The first data conductive layer 140 may include a first source/drain electrode SD1 and a second source/drain electrode SD2 of the transistor and a data line DTL.

The first and second source/drain electrodes SD1 and SD2 may be electrically coupled to both end regions of the active layer ACT through contact holes that penetrate the interlayer dielectric layer 123 and the gate insulating layer 122, respectively. In addition, the second source/drain electrode SD2 of the transistor may be electrically coupled to the bottom metal layer BML through a contact hole that penetrates through the interlayer dielectric layer 123, the gate insulator 122, and the buffer layer 121.

The data line DTL may apply a data signal to another transistor included in the display device 10. In some embodiments, the data line DTL may be coupled to a source/drain electrode of another transistor.

The first data conductive layer 140 may be made up of a single layer or a plurality of layers including at least one selected from molybdenum (Mo), aluminum (Al), chromium (Cr), gold (Au), titanium (Ti), nickel (Ni), neodymium (Nd), copper (Cu), and an alloy thereof. It is, however, to be understood that the present disclosure is not limited thereto.

A passivation layer 124 is on the first data conductive layer 140. The passivation layer 124 covers and protects the first data conductive layer 140. The passivation layer 124 may include inorganic insulating materials such as silicon oxide (SiOx), silicon nitride (SiNx), and/or silicon oxynitride (SiON).

A second data conductive layer 150 is on the passivation layer 124. The second data conductive layer 150 may include a first voltage line VL1 and a second voltage line VL2.

A high-level voltage (or a first supply voltage) may be applied to the first voltage line VL1, and a low-level voltage (or a second supply voltage) may be applied to the second voltage line VL2, which is lower than the high-level voltage (the first supply voltage) of the first voltage line VL1. The second voltage line VL2 may be electrically coupled to a second electrode 222 to apply the low-level voltage (second supply voltage) to the second electrode 222. In addition, an alignment signal utilized for aligning the light-emitting elements 300 during the process of fabricating the display device 10 may be applied to the second voltage line VL2.

The second data conductive layer 150 may further include a conductive pattern electrically coupled to the second source/drain electrode SD2 of the transistor through a contact hole that penetrates through the passivation layer 124. The conductive pattern is electrically to the first electrode 211 through a first contact hole CT1 (see FIGS. 2 and 3), such that the first supply voltage applied from the first voltage line VL1 may be transmitted to the first electrode 211.

The second data conductive layer 150 may be made up of a single layer or a plurality of layers including at least one selected from molybdenum (Mo), aluminum (Al), chromium (Cr), titanium (Ti), nickel (Ni), neodymium (Nd), copper (Cu), and an alloy thereof. It is, however, to be understood that the present disclosure is not limited thereto.

The via layer 125 is over the second data conductive layer 150. The via layer 125 may be on the passivation layer 124 on which the second data conductive layer 150 is included. The via layer 125 may provide a flat surface. The via layer 125 may include an organic insulating material, for example, an organic material such as polyimide (PI), but the present disclosure is not limited thereto.

Hereinafter, a plurality of layers of the emission material layer EML in one pixel PX of the display device 10 will be described with reference to FIGS. 2 to 4.

Referring to FIGS. 2 to 4, on the via layer 125 of the circuit element layer PAL, the first bank 400, the electrode layers 200, the plurality of light-emitting elements 300, the first contact electrode 711, the second contact electrode 712, the third contact electrode 610, the first pattern 720, the second bank 800, and a plurality of insulating layers 510, 520, 530, 540 may be included.

The first bank 400 may be on the via layer 125. The first bank 400 may include a first sub-bank 410 and a second sub-bank 420 spaced apart from each other in the first direction DR1.

The second sub-bank 420 may be at a central portion of the emission area EMA when viewed from the top. The second sub-bank 420 may be in the contact area CA of the emission area EMA. The second sub-bank 420 may include a shape that extends in the second direction DR2. The second sub-bank 420 may be separated and terminated in the emission area EMA such that it is does not extend to other adjacent pixels PX in the second direction DR2. It is, however, to be understood that the present disclosure is not limited thereto. The second sub-bank 420 may extend to adjacent pixels PX in the second direction DR2.

The first sub-banks 410 may be spaced apart from the second sub-bank 420 on the right side (e.g., one side in the first direction DR1) and the left side (e.g., the other side in the first direction DR1) of the second sub-bank 420 when viewed from the top. The first sub-banks 410 may be spaced apart from and face the second sub-bank 420 in the first direction DR1. There may be the areas between the each of the first sub-banks 410 and the second sub-bank 420 spaced apart from each other in the first direction DR1, where the light-emitting elements 300 are included.

The first sub-bank 410 may have a shape that extends in the second direction DR2 and the upper end and the lower end of the first sub-bank 410 are terminated within the pixel PX such that they do not extend to other pixels PX adjacent to the pixel PX in the second direction DR2. It is, however, to be understood that the present disclosure is not limited thereto. The first sub-bank 410 may extend to adjacent pixels PX in the second direction DR2.

The second sub-bank 410 may extend from the emission area EMA to the non-emission area. The first sub-bank 410 may extend across other adjacent pixels PX in the first direction DR1. For example, the first sub-banks 410 may be at the boundaries between adjacent pixels PX in the first direction DR1, including the emission areas EMA of the pixels PX.

The width of the first sub-bank 410 in the first direction DR1 may be different from the width of the second sub-bank 420 in the first direction DR1. In an exemplary embodiment, the width of the first sub-bank 410 in the first direction DR1 may be greater than the width of the second sub-bank 420 in the first direction DR1 It is, however, to be understood that the present disclosure is not limited thereto. The width of the first sub-bank 410 in the first direction DR1 may be equal to the width of the second sub-bank 420 in the first direction DR1.

Although the first bank 400 in the pixel PX includes the two first sub-banks 410 spaced apart from each other in the first direction DR1 and the one second sub-bank 420 therebetween in the drawings, the present disclosure is not limited thereto. The first bank 400 included in each pixel PX may have different shapes and locations depending on the shape or arrangement of the electrode layer further described herein below.

At least a portion of the first and second sub-banks 410 and 420 may have a protruding structure from the upper surface of the via layer 125 in the cross section. Each of the first and second sub-banks 410 and 420 may include upper, lower and side surfaces. The lower surfaces of the first and second sub-banks 410 and 420 are placed on the upper surface of the via layer 125. The upper surfaces of the first and second sub-banks 410 and 420 may be located on a plane while the lower surfaces of the first and second sub-banks 410 and 420 may be located on another plane. The planes are generally parallel (e.g., substantially parallel) to each other, and thus, may have a generally uniform (e.g., substantially uniform) thickness.

Each of the first and second sub-banks 410 and 420 may include inclined side surfaces. For example, because the first and second sub-banks 410 and 420 include the inclined side surfaces, it is possible to direct toward the upper side (e.g., display side) the light, which is emitted from the light-emitting element 300 and travels toward the side surfaces of the first and second sub-banks 410 and 420. In some embodiments, the first and second sub-banks 410 and 420 may provide the spaces in which the light-emitting elements 300 are included and may also work as reflective partition walls that change the direction of light emitted from the light-emitting elements 300 to be further described herein below toward the display side.

Although the side surfaces of the first and second sub banks 410 and 420 are linearly inclined in the drawings, the present disclosure is not limited thereto. For example, each the side surfaces of the first and second sub-banks 410 and 420 may have a curved semicircle or semi-ellipse shape.

The first bank 400 may include, but is not limited to, an organic insulating material such as polyimide (PI).

The electrode layers 200 may be on the first bank 400. The electrode layers 200 may be partially on the first bank 400 and the via layer 125 exposed by the first bank 400.

The electrode layers 200 may include a first electrode layer 210 and a second electrode layer 220. The first electrode layer 210 may be on the first sub-banks 410. The second electrode layer 220 may be on the second sub-bank 420.

The first electrode layer 210 may include a first electrode 211 and a first electrode pattern 212. In one pixel PX, the first electrode 211 may be on the first sub-bank 410 on the left hand, and the first electrode pattern 212 may be on the first sub-bank on the right hand in the plan view. The first electrode 211 and the first electrode pattern 212 may be on a part of the upper surface and the side surfaces of the first sub-banks 410.

The first electrode 211 and the first electrode pattern 212 may include a shape that extends in the second direction DR2. The first electrode 211 and the first electrode pattern 212 may extend in the second direction DR2 and may be spaced apart from each other in the first direction DR1.

The first electrode 211 and the first electrode pattern 212 may extend in the second direction DR2, and may be separated from those of another pixel PX adjacent to the pixel PX in the second direction DR2, respectively, such that they do not extend to the other pixel PX. For example, the first electrode 211 and the first electrode pattern 212 may be separated from the first electrode 211 and the first electrode pattern 212 included in an adjacent pixel PX, respectively, in the cut area CBA.

In the plan view, the shapes of the first electrode 211 and the first electrode pattern 212 are generally axially symmetrical around (or about) a line that extends in the second direction DR2 and that passes through the central portion of the emission area EMA of the pixel PX.

Hereinafter, the shape of the first electrode 211 when viewed from the top will be mainly described. As described above, the shape of the first electrode pattern 212 is symmetric to the shape of the first electrode 211 when viewed from the top, and thus, the description of the shape of the first electrode 211 when viewed from the top can be equally applied to the shape of the first electrode pattern 212.

The first electrode 211 may include an expanded portion 211E, bent portions 211B1 and 211B2, and connection portions 211C1 and 211C2 coupling the expanded portion 211E with the bent portions 211B1 and 211B2. The first electrode 211 may have a shape that generally extends in the second direction DR2, and may have a partially larger width or may be bent in a direction inclined from the second direction DR2.

The expanded portion 211E has the largest width in the first electrode 211 in the first direction DR1 and may be a central portion of the first electrode 211. The expanded portion 211E may be on the first sub-bank 410 in the emission area EMA of one pixel PX and may extend in the second direction DR2. The light-emitting elements 300 to be further described herein below may be on the expanded portion 211E of the first electrode 211 in the emission area EMA. The expanded portion 211E may have a width smaller than that of the first sub-bank 410 in the first direction DR1, and may extend outwardly from the side surface of the first sub-bank 410 to be partially on the via layer 125.

The bent portions 211B1 and 211B2 may include a first bent portion 211B1 and a second bent portion 211B2. The first bent portion 211B1 may be on one side of the expanded portion 211E in the second direction DR2. For example, the first bent portion 211B1 may be on the upper side of the expanded portion 211E to be spaced apart from it and may be inclined to the upper right side. The second bent portion 211B2 may be on the other side of the expanded portion 211E in the second direction DR2. For example, the second bent portion 211B2 may be on the lower side of the expanded portion 211E to be spaced apart from it and may be inclined to the lower right side.

A fragment portion 211D may be formed at one end of the first bent portion 21161, which is the remaining portion of the first electrode 211 cut in the cut area CBA. The fragment portion 211D may refer to the remaining portion of each of the first electrodes 211 cut in the cut area CBA in the pixels PX adjacent to one another in the second direction DR2.

The connection portions 211C1 and 211C2 may include a first connection portion 211C1 and a second connection portion 211C2. The first connection portion 211C1 may couple the expanded portion 211E with the first bent portion 211B1 in the second direction DR2. The second connection portion 211C2 may couple the expanded portion 211E with the second bent portion 211B1 in the second direction DR2. The connection portions 211C1 and 211C2 may overlap the emission area EMA of each pixel PX and the second bank 800, which will be further described herein below.

The width of the first connection portion 211C1 and the second connection portion 211C2 in the first direction DR1 may be smaller than the width of the expanded portion 211E in the first direction DR1. One side of each of the connection portions 211C1 and 211C2 that extend in the second direction DR2 may be arranged on the same line as one side of the expanded portion 211E extended in the second direction DR2. For example, the side of the expanded portion 211E and the sides of the connection portions 211C1 and 211C2 that are located more to the outer side from the emission area EMA may extend and be coupled to one another.

The distance between the second electrode pattern 221 and the first electrode 211, which will be further described herein below, may vary along the second direction DR2. For example, the distance DE1 between the expanded portion 211E of the first electrode 211 and the second electrode pattern 221 may be smaller than the distance DE2 between the connection portions 211C1 and 211C2 of the first electrode 211 and the second electrode pattern 211, and the distance DE3 between the fragment portion 211D of the first electrode 211 and the second electrode pattern 211. In addition, the distance DE3 between the fragment portion 211D of the first electrode 211 and the second electrode pattern 221 may be smaller than the distance DE2 between the connection portions 211C1 and 211C2 of the first electrode 211 and the second electrode pattern 221. It is, however, to be understood that the present disclosure is not limited thereto.

The first electrode 211 may further include a contact portion 211P unlike the first electrode pattern 212. The contact portion 211P may be between the first connection portion 211C1 and the first bent portion 211B1 to overlap the second bank 800. The width of the contact portion 211P may be larger than that of each of the first connection portion 211C1 and the first bent portion 21161. The contact portion 211P may overlap the contact hole CT1. In some embodiments, the contact hole CT1 may be formed through the via layer 125, and the first electrode 211 may be electrically coupled to the transistor through the contact hole CT1 that penetrates through the via layer 125. In addition, an alignment signal may be applied to the first electrode 211 of the first electrode layer 210 through the first contact hole CT1 during a process of aligning the light-emitting elements 300, which are further described herein below.

The second electrode layer 220 may be between the first electrode 211 and the first electrode pattern 212 of the first electrode layer 210.

The second electrode layer 210 may include a second electrode 222 and a second electrode pattern 221. The second electrode 22 and the second electrode pattern 221 may be on the same second sub-bank 420 in one pixel PX. For example, the second electrode 222 may be on the right side of the second sub-bank 420 in the pixel PX when viewed from the top. The second electrode pattern 221 may be on the left side of the second sub-bank 420 in the pixel PX when viewed from the top. The second electrode pattern 221 may be closer to the first electrode 211 on the second sub-bank 420 to face the first electrode 211. The second electrode 222 may be closer to the first electrode pattern 212 on the second sub-bank 420 to face the first electrode pattern 212. For example, the second electrode 222 may be between the first electrode 211 and the first electrode pattern 212, while the second electrode pattern 221 may be between the first electrode 211 and the second electrode 222.

The second electrode 222 and the second electrode pattern 221 may include a shape that extends in the second direction DR2. The second electrode 222 and the second electrode pattern 221 may extend in the second direction DR2 and may be spaced apart from each other in the first direction DR1. The second electrode 222 and the second electrode pattern 221 may be spaced apart from each other on the upper surface of the second sub-bank 420.

The second electrode 222 and the second electrode pattern 221 may extend in the second direction DR2, and may be separated from those of another pixel PX adjacent to the pixel PX in the second direction DR2, respectively, such that they do not extend to the other pixel PX. For example, the second electrode 222 and the second electrode pattern 221 may be separated from the second electrode 222 and the second electrode pattern 221 included in an adjacent pixel PX, respectively, in the cut area CBA.

In the plan view, the shapes of the second electrode 222 and the second electrode pattern 221 are axially symmetrical around (or about) a line that extends in the second direction DR2 and that passes through the central portion of the emission area EMA of the pixel PX.

The second electrode 222 may be electrically coupled to the second voltage line VL2 through the second contact hole CT2. In addition, an alignment signal may be applied to the second electrode 220 of the second electrode layer 222 through the second contact hole CT2 during a process of aligning the light-emitting elements 300, which will be further described herein below.

The first electrode pattern 212 and the second electrode pattern 221 may be floating, such that substantially no electric signal is directly applied from the transistor and/or the second voltage line VL2. However, the third contact electrode 610 to be further described herein below is on the electrode layer 200 where the contact holes CT1 and CT2 are not formed, e.g., the first electrode pattern 212 and the second electrode pattern 221, and the electric signal transmitted to the light-emitting elements 300 from the first electrode 211 may flow through the third contact electrode 610.

The first insulating layer 510 may be on the electrode layer 200. The first insulating layer 510 may be on the via layer 125 exposed by the electrode layer 200 and the electrode layer 200. The first insulating layer 510 may expose at least a portion of the electrode layer 200 in the third direction DR3. For example, the first insulating layer 510 may be entirely on the substrate 110, and at least a part of the surface of each of the first electrode 211, the first electrode pattern 212, the second electrode 222 and the second electrode pattern 221. The surface of each of the first electrode 211, the first electrode pattern 212, the second electrode 222 and the second electrode pattern 221 exposed by the first insulating layer 510 may be in contact (e.g., physical contact) with the contact electrodes 711, 712, and 610 and may electrically couple the light-emitting elements 300 with the first electrode 211 and the second electrode 222.

The first insulating layer 510 may have a level difference such that a part of the upper surface is recessed between the first electrode 211 and the second electrode 221. In addition, the first insulating layer 510 may have a level difference such that a part of the upper surface is recessed between the second electrode 222 and the first electrode pattern 212. A part of the upper surface of the first insulating layer 510 may be recessed due to level differences of the elements thereunder. In some exemplary embodiments, a level difference may be formed between the first electrode 211 and the second electrode pattern 221 and/or between the second electrode 222 and the first electrode pattern 212, such that an empty space may be formed between the recessed upper surface of the first insulating layer 510 and the light-emitting elements 300. The empty space between the first insulating layer 510 and the light-emitting elements 300 may be filled with a material of the second insulating layer 520. It is, however, to be understood that the present disclosure is not limited thereto. No level difference may be formed in the first insulating layer 510 between the first electrode 211 and the second electrode pattern 221 and/or between the second electrode 222 and the first electrode pattern 212. For example, the first insulating layer 510 may include a flat upper surface such that the light-emitting elements 300 are between the first electrode 211 and the second electrode pattern 221 and/or between the second electrode 222 and the first electrode pattern 212.

The first insulating layer 510 may be between the first electrode 211 and the second electrode pattern 221, and between the second electrode 222 and the first electrode pattern 212, to protect them and also to insulate (e.g., electrically insulate) them from one another. In addition, it can prevent or reduce contact of the light-emitting element 300 on the first insulating layer 510 with other elements, thereby preventing or reducing damage to the light-emitting element 300 that would otherwise result.

The second bank 800 may be on the first insulating layer 510. The second bank 800 may be on the upper surface of the first sub-bank 410 on which the first insulating layer 510 is provided. The second bank 800 may be in a lattice pattern on the entire surface of the display area DPA including portions that extend in the first direction DR1 and the second direction DR2 when viewed from the top. The second bank 800 may be along the border of each of the pixels PX to distinguish adjacent pixels PX from one another.

In addition, the second bank 800 may surround the emission area EMA and the cut area CBA in each of the pixels PX to distinguish them. The first electrode layer 210 and the second electrode layer 220 may extend in the second direction DR2 and may extend across a portion of the second bank 800 that extends in the first direction DR1. The width of the portion of the second bank 800 that extends in the second direction DR2 may vary along the first direction DR1. For example, the width of the portion of the second bank 800 that extends in the second direction DR2 and located between the emission areas EMA adjacent to each other in the first direction DR1 may be greater than the width of the portion between the cut areas CBA adjacent to each other in the first direction DR1. It is, however, to be understood that the present disclosure is not limited thereto.

The second bank 800 can prevent or reduce overflow of an ink into adjacent pixels PX during an inkjet printing process of the process of fabricating the display device 10. The second bank 800 may separate the pixels PX from one another such that the ink in which different light-emitting elements 300 are dispersed are not mixed. The second bank 800 may include, but is not limited to, polyimide (PI), like the first bank 400.

The light-emitting elements 300 may be on the first insulating layer 510. The light-emitting elements 300 may include different materials to emit light of different wavelength bands to the outside.

The light-emitting elements 300 may be arranged and spaced apart from one another along the second direction DR2 in which the first electrode 211, the second electrode pattern 221, the second electrode 222 and the first electrode pattern 212 extend, and may be arranged substantially parallel to one another. The spacing between the light-emitting elements 300 is not particularly limited herein. In addition, the light-emitting element 300 may have a shape that extends in one direction. The direction in which the first electrode 211, the second electrode pattern 221, the second electrode 222 and the first electrode pattern 212 extend may be substantially perpendicular to the direction in which the light-emitting elements 300 extend. It is, however, to be understood that the present disclosure is not limited thereto. The light-emitting elements 300 may not be perpendicular to but may be oriented obliquely to the direction in which the first electrode 211, the second electrode pattern 221, the second electrode 222 and the first electrode pattern 212 extend.

The plurality of light-emitting elements 300 may include first light-emitting elements 300 between the first electrode 211 and the second electrode pattern 221, and second light-emitting elements 300 between the second electrode 222 and the first electrode pattern 212. For example, the first light-emitting elements 300 may be arranged on the left hand of the drawing while the second light-emitting elements 300 may be arranged on the right hand of the drawing.

Both ends of each of the light-emitting elements 300 may be on the electrode layers 200 on the first insulating layer 510. An orientation of first semiconductor layers 310 (see FIG. 5) of the first light-emitting elements 300 between the first electrode 211 and the second electrode pattern 221 may be different from the orientation of the first semiconductor layers 310 of the second light-emitting elements between the second electrode 222 and the first electrode pattern 212. For example, the first light-emitting elements 300 may be aligned on the first insulating layer 510 between the first electrode 211 and the second electrode pattern 221 such that the ends of the first semiconductor layers 310 of the first light-emitting elements 300 are on the second electrode pattern 221. For example, the second light-emitting elements 300 may be aligned on the first insulating layer 510 between the second electrode 222 and the first electrode pattern 212 such that the ends of the first semiconductor layers 310 of the second light-emitting elements 300 are on the second electrode pattern 222. For example, the end of each of the light-emitting elements 300 where the first semiconductor layer 310 is provided is defined as a first end. Then, the first ends of the light-emitting elements 300 on the left side and the first ends of the light-emitting elements 300 on the right side may face opposite directions in the pixel PX when viewed from the top. It is, however, to be noted that the directions in which the first ends of the light-emitting elements 300 face are not limited thereto.

The second insulating layer 520 may be on the light-emitting elements 300. The second insulating layer 520 may be partially on the light-emitting elements 300. The second insulating layer 520 may partially surround the outer surfaces of the light-emitting elements 300 such that the first ends and the other ends of the light-emitting elements 300 are not covered. The first to third contact electrodes 711, 712 and 610, which will be further described herein below, may be in contact (e.g., physical contact) with both ends of the light-emitting elements 300 not covered by the second insulating layer PAS2. A portion of the second insulating layer 520 on the light-emitting elements 300 may form a linear or island-like pattern in the pixel PX when viewed from the top. The second insulating layer 520 can protect the light-emitting elements 300 and fix the light-emitting elements 300 during the process of fabricating the display device 10.

Referring to FIGS. 3 and 4, the first contact electrode 711, the second contact electrode 712, the third contact electrode 610, the first pattern 720 and the third contact electrode 530 may be on the second insulating layer 520. Hereinafter, the relative arrangement of the first contact electrode 711, the second contact electrode 712, the third contact electrode 610, the first pattern 720, and the third contact electrode 530 when viewed from the top will be described.

The first contact electrode 711 may be on a part of the first electrode 211 in the contact area CA. For example, the first contact electrode 711 may be on the expanded portion 211E of the first electrode 211 when viewed from the top to have a shape that extends in the second direction DR2. The first contact electrode 711 may be on the first electrode 211 and may extend toward the first light-emitting elements 300 to overlap the first ends of the light-emitting elements 300.

The second contact electrode 712 may be on a part of the second electrode 222 in the contact area CA. For example, the second contact electrode 712 may be on the second electrode 222 when viewed from the top to have a shape that extends in the second direction DR2. The second contact electrode 712 may be on the second electrode 222 and may extend toward the second light-emitting elements 300 to overlap the first ends of the light-emitting elements 300.

The first contact electrode 711 and the second contact electrode 712 may be in contact (e.g., physical contact) with the first electrode 211 and the second electrode 222 having the first contact hole CT1 and the second contact hole CT2, respectively. The first contact electrode 711 may be in contact (e.g., physical contact) with the first electrode 211 electrically coupled to the transistor through the first contact hole CT1, and the second contact electrode 712 may be in contact (e.g., physical contact) with the second electrode 222 electrically coupled to the second voltage line VL2 through the second contact hole CT2. The first contact electrode 711 and the second contact electrode 712 may transmit electric signals applied from the transistor and/or the second voltage line VL2 to the light-emitting elements 300.

The first pattern 720 may overlap with the third region 620 of the third contact electrode 610 further described herein below in the line area LA. The first pattern 720 may be in contact (e.g., physical contact) with at least a part of the third region 620 of the third contact electrode 610. A further description thereof will be provided herein below.

The first contact electrode 711, the second contact electrode 712 and the first pattern 720 may be spaced apart from one another. In some exemplary embodiments, the first contact electrode 711, the second contact electrode 712 and the first pattern 720 may be formed on the same layer. The first contact electrode 711, the second contact electrode 712 and the first pattern 720 may be patterned and formed via the same mask process. It is, however, to be understood that the present disclosure is not limited thereto. In some other exemplary embodiments, the first pattern 720 may be formed on a different layer from the first and second contact electrodes 711 and 712. For example, the first pattern 720 may be formed via a subsequent process after the first and second contact electrodes 711 and 712 have been formed.

The third contact electrode 610 may include a closed loop shape when viewed from the top. The third contact electrode 610 may include a first area 611 and a second area 612 in the contact area CA and a third area 620 in the line area LA. For example, the third contact electrode 610 may include the first area 611 on the second electrode pattern 221 in the contact area CA, the second area 612 on the first electrode pattern 212 in the contact region CA, and the third area 620 in the line area LA.

The first area 611 and the second area 612 of the third contact electrode 610 may be spaced apart from each other and extend in the second direction DR2. The third area 620 of the third contact electrode 610 may couple the first area 611 with the second area 612 of the third contact electrode

610. The third contact electrode 610 may include the first area 611 and the second area 612 that extends in the first direction DR1 and the third area 620 coupling between them, to surround the second contact electrode 712.

The first area 611 and the second area 612 of the third contact electrode 610 may be on the first electrode pattern 212 and the second electrode pattern 221 where the contact holes CT1 and CT2 are not formed, respectively, and may be in contact (e.g., physical contact) with the light-emitting elements 300. The third area 620 of the third contact electrode 610 may overlap the second electrode 222 in which the second contact hole CT2 is formed with the first insulating layer 510 between them, so that they may not be directly coupled to each other.

The first area 611 of the third contact electrode 610 may be on a part of the second electrode pattern 221. For example, the first area 611 of the third contact electrode 610 may be on the second electrode pattern 221 and may have a shape that extends in the second direction DR2 when viewed from the top. The first area 611 of the third contact electrode 610 may be on the second electrode pattern 221 and may extend toward the first light-emitting elements 300 to overlap the other ends of the light-emitting elements 300.

The second area 612 of the third contact electrode 612 may be on a part of the first electrode pattern 212. For example, the second area 612 of the third contact electrode 610 may be on the first electrode pattern 212 and may have a shape that extends in the second direction DR2 when viewed from the top. The second area 612 of the third contact electrode 610 may be on the first electrode pattern 212 and may extend toward the second light-emitting elements 300 to overlap the other ends of the light-emitting elements 300. The second area 612 of the third contact electrode 610 may be spaced apart from the first area 611 of the third contact electrode 610.

The third area 620 of the third contact electrode 610 may be in the line area LA and may couple the first area 611 with the second area 612 of the third contact electrode 610. The third areas 620 of the third contact electrode 610 may have a shape that extends in the first direction DR1 such that they couple both ends of the first area 611 with both ends of the second area 612 of the third contact electrode 610, respectively.

The first area 611, the second area 612 and the third areas 620 of the third contact electrode 610 may be coupled integrally to have a closed loop shape. The third contact electrode 610 may surround the second contact electrode 712.

Hereinafter, the cross-sectional structure of the first contact electrode 711, the second contact electrode 712, the third contact electrode 610, the first pattern 720 and the third contact electrode 530 will be described with reference to FIG. 4.

The third contact electrode 610 may also be on the second insulating layer 520. As described above, the third contact electrode 610 may include the first and second areas 611 and 612 in the contact area CA and the third area 620 in the line area LA.

The first area 611 of the third contact electrode 610 may be in direct contact (e.g., physical contact) with the first ends of the light-emitting elements 300 and the surface of the second electrode pattern 221. The first area 611 of the third contact electrode 610 may be partially on the upper surface of the second insulating layer 520 on the light-emitting elements 300. The first area 611 may not overlap the second electrode 222 on the second sub-bank 420 in the third direction DR3 and may not be on the second electrode 222.

The second area 612 of the third contact electrode 610 may be in direct contact (e.g., physical contact) with the first ends of the light-emitting elements 300 and the surface of the first electrode pattern 212. The second area 612 of the third contact electrode 610 may be partially on the upper surface of the second insulating layer 520 on the light-emitting elements 300.

The third area 620 of the third contact electrode 610 may be on the first insulating layer 510 in the line area LA. The third area 620 of the third contact electrode 610 may partially overlap the second electrode layer 220 in the line area LA, e.g., the second electrode 222 and the second electrode pattern 221. The third area 620 of the third contact electrode 610 may be on the entire surface of the line area LA.

The third contact electrode 610 may include a conductive material (e.g., an electrically conductive material). For example, the third contact electrode 610 may include ITO, IZO, ITZO, aluminum (Al), etc. For example, the third contact electrode 610 may include a transparent conductive material, and light emitted from the light-emitting elements 300 may exit through both side surfaces as well as both end surfaces of the light-emitting elements 300. The light exiting through one end surface of the light-emitting element 300 may transmit the third contact electrode 610 in the contact area CA in contact (e.g., physical contact) with the end surface of the light-emitting element 300, e., the first area 611 and the second area 612 to exit. The light emitted from the light-emitting element 300 to transmit the third contact electrode 610 may be reflected from the side surfaces of the first and second sub-banks 410 and 420 to travel in the display direction (e.g., the third direction DR3). It is, however, to be understood that the present disclosure is not limited thereto. According to an exemplary embodiment of the present disclosure, the third contact electrode 610 may include, but is not limited to, crystalline ITO.

The third insulating layer 530 is on the third contact electrode 610. The third insulating layer 530 may be on the contact area CA but not in the line area LA. For example, the third insulating layer 530 may completely cover the first area 611 of the third contact electrode 610 in the contact area CA and the second area 612 of the third contact electrode 610, and the third area 620 of the third contact electrode 610 in the line area LA may be exposed in the third direction DR3. In some embodiments, the third insulating layer 530 may overlap the third contact electrode 610 in the contact area CA and may not overlap in the line area LA.

The third insulating layer 530 may electrically insulate the control electrode 610 from the first contact electrode 711 and the second contact electrode 712. The third insulating layer 530 may cover the first area 611 and the second area 612 of the third contact electrode 610 but may not be on the other ends of the light-emitting elements 300 such that the light-emitting elements 300 are in contact (e.g., physical contact) with the first contact electrode 711 and the second contact electrode 712. One side surface of the third insulating layer 530 may be aligned with one side surface of the second insulating layer 520.

The first contact electrode 711, the second contact electrode 712 and the first pattern 720 may be on the third insulating layer 530. The first contact electrode 711 and the second contact electrode 712 may be in the contact area CA. The first pattern 720 may be in the line area LA.

The first contact electrode 711 may be in direct contact (e.g., physical contact) with the other ends of the light-emitting elements 300 and the surface of the first electrode 211. The first contact electrode 711 may be partially on the upper surface of the third insulating layer 530 on the light-emitting elements 300. The second contact electrode 712 may be in direct contact (e.g., physical contact) with the other ends of the light-emitting elements 300 and a surface of the second electrode 222. The second contact electrode 712 may be partially on the upper surface of the third insulating layer 530 on the light-emitting elements 300.

The first pattern 720 may be on the third area 620 of the third contact electrode 610 in the line area LA. According to an exemplary embodiment of the present disclosure, the first pattern 720 may be in direct contact (e.g., physical contact) with the third area 620 of the third contact electrode 610. The lower surface of the first pattern 720 may be in contact (e.g., physical contact) with the upper surface of the third area 620 of the third contact electrode 610, and the lower surface of the first pattern 720 and the upper surface of the third area 620 of the third contact electrode 610 may be on the same plane. Although the first pattern 720 in the line area LA is entirely on and in contact (e.g., physical contact) with the third area 620 of the third contact electrode 610 in the example shown in FIG. 4, the present disclosure is not limited thereto. Further description thereof will be provided below with reference to the other drawings.

The first contact electrode 711, the second contact electrode 712 and the first pattern 720 may include the same (e.g., substantially the same) material. For example, each of the first contact electrode 711, the second contact electrode 712 and the first pattern 720 may include a conductive material (e.g., an electrically conductive material). For example, the first contact electrode 711, the second contact electrode 712 and the first pattern 720 may include ITO, IZO, ITZO, aluminum (Al), etc. For example, each of the first contact electrode 711, the second contact electrode 712 and the first pattern 720 may include a transparent conductive material, and the light emitted from the light-emitting element 300 may exit through its both end surfaces as well as both side surfaces as described above. The light exiting through the other end surface of the light-emitting element 300 may transmit the first contact electrode 711 and the second contact electrode 712 in the contact area CA in contact (e.g., physical contact) with the other end surface of the light-emitting element 300. The light emitted from the light-emitting element 300 to transmit the first contact electrode 711 and the second contact electrode 712 may be reflected off the side surfaces of the first and second sub-banks 410 and 420 to travel in the display direction (e.g., the third direction DR3). It is, however, to be understood that the present disclosure is not limited thereto. According to an exemplary embodiment of the present disclosure, the first contact electrode 711, the second contact electrode 712 and the first pattern 720 may include, but is not limited to, at least one selected from amorphous ITO and crystalline ITO.

The electric signal transmitted from the first contact electrode 711 in contact (e.g., physical contact) with the first electrode 211 to the first end of the first light-emitting element 300 (e.g., the light-emitting element on the left hand in the drawing) is transmitted to the first area 611 of the third contact electrode 610 in contact (e.g., physical contact) with the other end of the first light-emitting element 300. The third contact electrode 610 may transmit the electric signal from the first area 611 in the contact area CA back to the second area 612 in the contact area CA through the third area 620 in the line area LA. The electric signal transmitted to the second area 612 of the third contact electrode 610 may be transmitted to one end of the second light-emitting element 300 (e.g., the light-emitting element on the right side in the drawing), which may be transmitted to the second contact electrode 222 through the electrode 712. Accordingly, the electric signal for light emission of the light-emitting element 300 may be transmitted to only one first electrode 211 and one second electrode 222, and the first light-emitting element 300 on the left side and the light-emitting element 300 on the right side may be coupled in series through the third contact electrode 610.

The fourth insulating layer 540 may be entirely on the substrate 110. The fourth insulating layer 540 can protect the elements on the substrate 110 against the external environment. According to an exemplary embodiment, the fourth insulating layer 540 may completely cover the second bank 800, the third insulating layer 530, the first to third contact electrodes 711, 712 and 610 and the first pattern 720 on the substrate 110.

Each of the above-described first insulating layer 510, second insulating layer 520, third insulating layer 530 and fourth insulating layer 540 may include an inorganic insulating material or an organic insulating material. According to an exemplary embodiment of the present disclosure, the first insulating layer 510, the second insulating layer 520, the third insulating layer 530 and the fourth insulating layer 540 may include an inorganic insulating material such as silicon oxide (SiOx), silicon nitride (SiNx), silicon oxynitride (SiOxNy), aluminum oxide (AlxOy), and/or aluminum nitride (AlN). In some embodiments, the first insulating layer 510, the second insulating layer 520, the third insulating layer 530 and the fourth insulating layer 540 may include, as an organic insulating material, an acrylic resin, an epoxy resin, a phenol resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, a polymethyl methacrylate-polycarbonate synthetic resin, etc. It is, however, to be understood that the present disclosure is not limited thereto.

Figure 5:
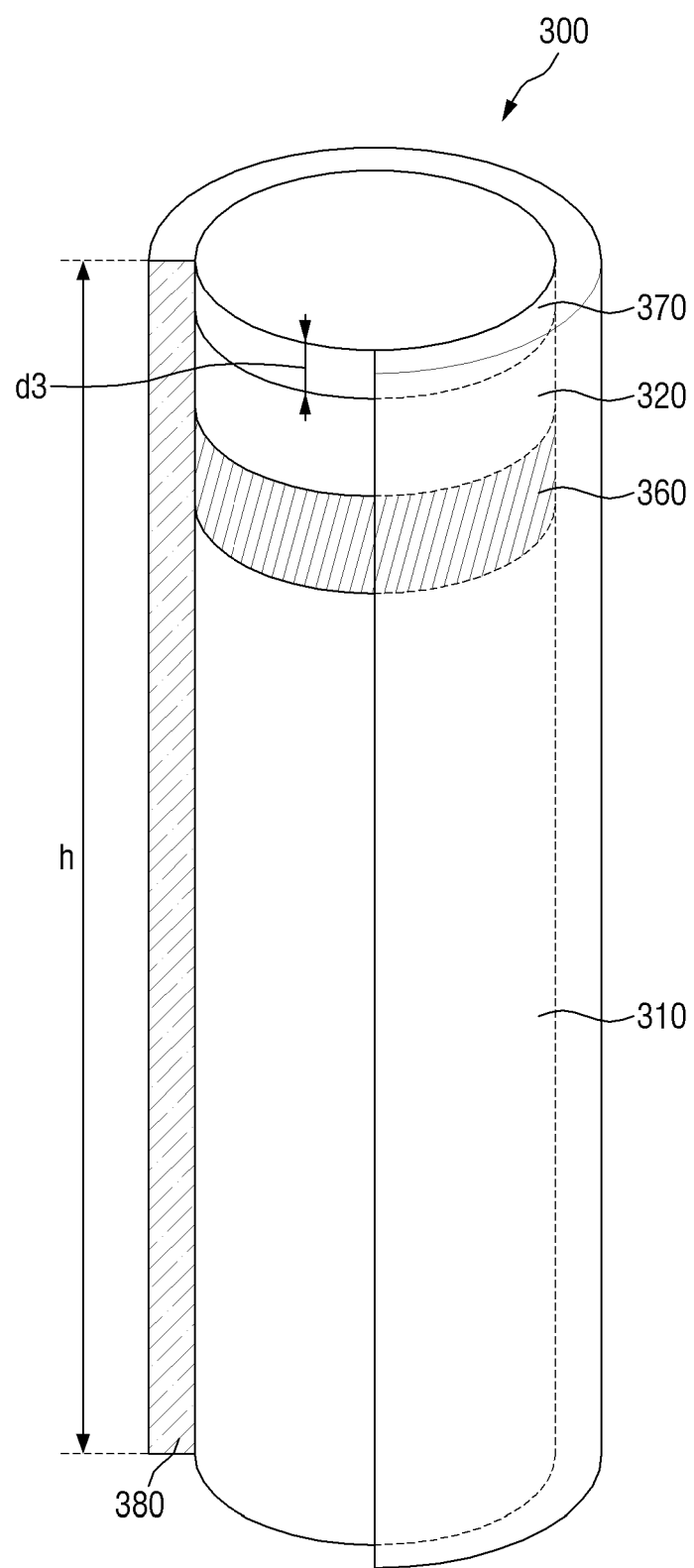
FIG. 5 is a perspective view of a light-emitting element according to an exemplary embodiment of the present disclosure.

FIG. 5 is a perspective view of a light-emitting element according to an exemplary embodiment of the present disclosure.

The light-emitting elements 300 may include light-emitting diodes. For example, the light-emitting elements 300 may have a size in a range of micrometers or nanometers and may be inorganic light-emitting diodes made of an inorganic material. The inorganic light-emitting diodes may be arranged by forming an electric field between two electrode layers facing each other. For example, the inorganic light-emitting diodes may be aligned between the two electrodes by forming an electric field in a set or specific direction to have polarities between the two electrode layers.

The light-emitting element 300 according to an exemplary embodiment may have a shape that extends in one direction. The light-emitting element 300 may have a shape of a rod, wire, tube, etc. In an exemplary embodiment, the light-emitting element 300 may have a cylindrical or rod-like shape. It is to be understood that the shape of the light-emitting element 300 is not limited thereto. The light-emitting element 300 may have a variety of shapes including a polygonal column shape such as a cube, a cuboid, or a hexagonal column, or a shape that extends in a direction with partially inclined outer surfaces. The plurality of semiconductors included in the light-emitting element 300 to be further described herein below may have a structure sequentially arranged or stacked along the direction in which the light-emitting elements 300 extend.

The light-emitting element 300 may include a semiconductor layer doped with impurities of a conductive type (e.g., p-type or n-type). The semiconductor layer may emit light of a set or certain wavelength band by transmitting an electric signal applied from an external power source.

Referring to FIG. 5, the light-emitting element 300 may include a first semiconductor layer 310, a second semiconductor layer 320, an active layer 360, an element electrode layer 370, and an insulating layer 380.

The first semiconductor layer 310 may be an n-type semiconductor. For example, when the light-emitting element 300 emits light of a blue wavelength band, the first semiconductor layer 310 may include a semiconductor material having the following chemical formula: $Al_xGa_yIn_{1-x-y}N$ ($0 \leq x \leq 1$, $0 \leq y \leq 1$, $0 \leq x+y \leq 1$). For example, the semiconductor material may be at least one selected from n-type doped AlGaInN, GaN, AlGaN, InGaN, AlN, and InN. The first semiconductor layer 310 may be doped with an n-type dopant, and the n-type dopant may include Si, Ge, Sn, etc., for example. According to an exemplary embodiment of the present disclosure, the first semiconductor layer 310 may be n-GaN doped with n-type Si. The length of the first semiconductor layer 310 in the direction may be in, but is not limited to, a range of from 1.5 µm to 5 µm.

The second semiconductor layer 320 may be spaced apart from the first semiconductor layer 310 along the direction in which the light-emitting element 300 extends. The second semiconductor layer 320 may be a p-type semiconductor. For example, when the light-emitting element 300 emits light of a blue or green wavelength band, the second semiconductor layer 320 may include a semiconductor material having the following chemical formula: $Al_xGa_yIn_{1-x-y}N$ ($0 \leq x \leq 1$, $0 \leq y \leq 1$, $0 \leq x+y \leq 1$). For example, the semiconductor material may be at least one selected from p-type doped AlGaInN, GaN, AlGaN, InGaN, AlN, and InN. The second semiconductor layer 320 may be doped with a p-type dopant, and the p-type dopant may be Mg, Zn, Ca, Se, Ba, etc., for example. According to an exemplary embodiment of the present disclosure, the second semiconductor layer 320 may be p-GaN doped with p-type Mg. The length of the second semiconductor layer 320 in the direction may be in, but is not limited to, a range of from 0.05 µm to 0.10 µm.

Although each of the first semiconductor layer 310 and the second semiconductor layer 320 is implemented as a signal layer in the drawings, the present disclosure is not limited thereto. According to some exemplary embodiments of the present disclosure, depending on the material of the active layer 360, the first semiconductor layer 310 and the second semiconductor layer 320 may further include a larger number of layers, e.g., a clad layer and/or a tensile strain barrier reducing (TSBR) layer.

The active layer 360 is between the first semiconductor layer 310 and the second semiconductor layer 320. The active layer 360 may include a material having a single or multiple quantum well structure. When the active layer 360 includes a material having the multiple quantum well structure, the structure may include quantum layers and well layers alternately stacked on one another. The active layer 360 may emit light as electron-hole pairs are combined therein in response to an electrical signal applied through the first semiconductor layer 310 and the second semiconductor layer 320. For example, when the active layer 360 emits light of the blue wavelength band, it may include a material such as AlGaN and/or AlGaInN. In some embodiments, when the active layer 360 has a multi-quantum well structure in which quantum layers and well layers are alternately stacked on one another, the quantum layers may include AlGaN and/or AlGaInN, and the well layers may include a material such as GaN and/or AlGaN. According to an exemplary embodiment of the present disclosure, the active layer 360 includes AlGaInN as the quantum layer and AlInN as the well layer, and, as described above, the active layer 360 may emit blue light having a center wavelength band in a range of 450 nm to 495 nm.

It is, however, to be understood that the present disclosure is not limited thereto. The active layer 360 may have a structure in which a semiconductor material having a large band gap energy and a semiconductor material having a small band gap energy are alternately stacked on one another, and may include other Group III to Group V semiconductor materials depending on the wavelength range of the emitted light. Accordingly, the light emitted from the active layer 360 is not limited to the light of the blue wavelength band. The emissive layer 36 may emit light of red or green wavelength band in some implementations. The length of the active layer 320 in the direction may be in, but is not limited to, a range of from 0.05 µm to 0.10 µm.

The light emitted from the active layer 360 may exit not only through the outer surfaces at both ends of the light-emitting element 30 in the longitudinal direction but also through both side surfaces. The direction in which the light emitted from the active layer 360 propagates is not limited to one direction.

The element electrode layer 370 may be on the second semiconductor layer 320. The element electrode layer 370 may include an ohmic contact electrode. It is, however, to be understood that the present disclosure is not limited thereto. The element electrode layer may include a Schottky contact electrode (e.g., an electrode having a junction formed by a semiconductor and a metal). The light-emitting element 300 may include at least one element electrode layer 370. Although the light-emitting element 300 includes one element electrode layer 37 in the example shown in FIG. 5, the present disclosure is not limited thereto. In some implementations, the light-emitting element 300 may include more than one element electrode layers 370.

In the display device 10 according to the exemplary embodiment of the present disclosure, the element electrode layer 370 can reduce the resistance between the light-emitting element 300 and the electrode layer 200 in the contact area CA or the first to third contact electrodes 711, 712 and 610 when the light-emitting element 300 is electrically coupled to the electrode layer 200 or the first to third contact electrodes 711, 712 and 610 in the contact area CA. The element electrode layer 370 may include a metal having conductivity (e.g., electrical conductivity). For example, the element electrode layer 370 may include at least one selected from aluminum (Al), titanium (Ti), indium (In), gold (Au), silver (Ag), indium tin oxide (ITO), indium zinc oxide (IZO), and indium tin-zinc oxide (ITZO). In addition, the element electrode layer 370 may include a semiconductor material doped with n-type or p-type impurities. The element electrode layer 370 may include the same (e.g., substantially the same) material and may include different materials. It is, however, to be understood that the present disclosure is not limited thereto.

According to an exemplary embodiment of the present disclosure, the element electrode layer 370 may include a transparent conductive material so that light emitted from the active layer 360 smoothly exits to both ends of the light-emitting element 300. For example, the element electrode layer 370 may include ITO. The thickness d3 of the element electrode layer 370 in the direction may be in, but is not limited to, a range of from 0.09 µm to 0.14 µm. The direction refers to the direction in which the light-emitting element 300 extends.

The insulating layer 380 surrounds the side surfaces of the semiconductor layers 310 and 320 and the element electrode layer 370 described above. According to an exemplary embodiment of the present disclosure, the insulating layer 380 may surround at least the side surface of the active layer 360, and may extend in a direction in which the light-emitting element 300 extends. The insulating layer 380 can protect the first semiconductor layer 310, the second semiconductor layer 320, the active layer 360, and the element electrode layer 370 described above. For example, the insulating layer 380 may be formed to surround the side portions of the first semiconductor layer 310, the second semiconductor layer 320, the active layer 360 and the element electrode layer 370, but both ends of the light-emitting elements 300 in the longitudinal direction may be exposed.

Although the insulating layer 380 extends in the longitudinal direction of the light-emitting element 300 to completely cover from the side surface of the first semiconductor layer 310 to the side surface of the element electrode layer 370 in the example shown in the drawing, the present disclosure is not limited thereto. The insulating layer 380 may cover only the side surface of a part of the semiconductor layer, including the active layer 360, or may cover only a part of the side surface of the element electrode layer 370 to partially expose the side surface of the element electrode layer 370. In addition, a part of the upper surface of the insulating layer 380 may be rounded which is adjacent to at least one end of the light-emitting element 300 in cross section.

The thickness of the insulating layer 380 may be in, but is not limited to, a range of 10 nm to 1.0 μm. For example, the thickness of the insulating layer 380 may be approximately 40 nm.

The insulating layer 380 may include materials having an insulating property (e.g., an electrically insulating property) such as silicon oxide (SiOx), silicon nitride (SiNx), silicon oxynitride (SiOxNy), aluminum nitride (AlN), and/or aluminum oxide (AlxOy). Accordingly, it is possible to prevent or reduce an electrical short-circuit that may occur when the active layer 360 comes in contact (e.g., physical contact) with an electrode through which an electric signal is transmitted to the light-emitting element 300. In addition, because the insulating layer 380 includes the active layer 360 to protect the outer surface of the light-emitting element 300, it is possible to prevent or reduce a decrease in luminous efficiency.

In addition, in some exemplary embodiments, the outer surface of the insulating layer 380 may be subjected to surface treatment. The light-emitting elements 300 may be dispersed in an ink, and the ink may be sprayed onto the electrode. In doing so, a surface treatment may be applied to the insulating layer 380 so that it becomes hydrophobic or hydrophilic in order to keep the light-emitting elements 300 dispersed in the ink from being aggregated with one another.

The length h of the light-emitting elements 300 may be in a range from 1 μm to 10 μm, from 2 μm to 6 μm, or, for example, approximately 3 μm to 5 μm. In addition, the diameter of the light-emitting elements 300 may be in a range of from 30 nm to 700 nm, and the aspect ratio of the light-emitting elements 300 may be in a range of from 1.2 to 100. It is, however, to be understood that the present disclosure is not limited thereto. The plurality of light-emitting elements 300 included in the display device 10 may have different diameters depending on a compositional difference of the active layer 360. For example, the diameter of the light-emitting elements 300 may be approximately 500 nm.

Figure 6:
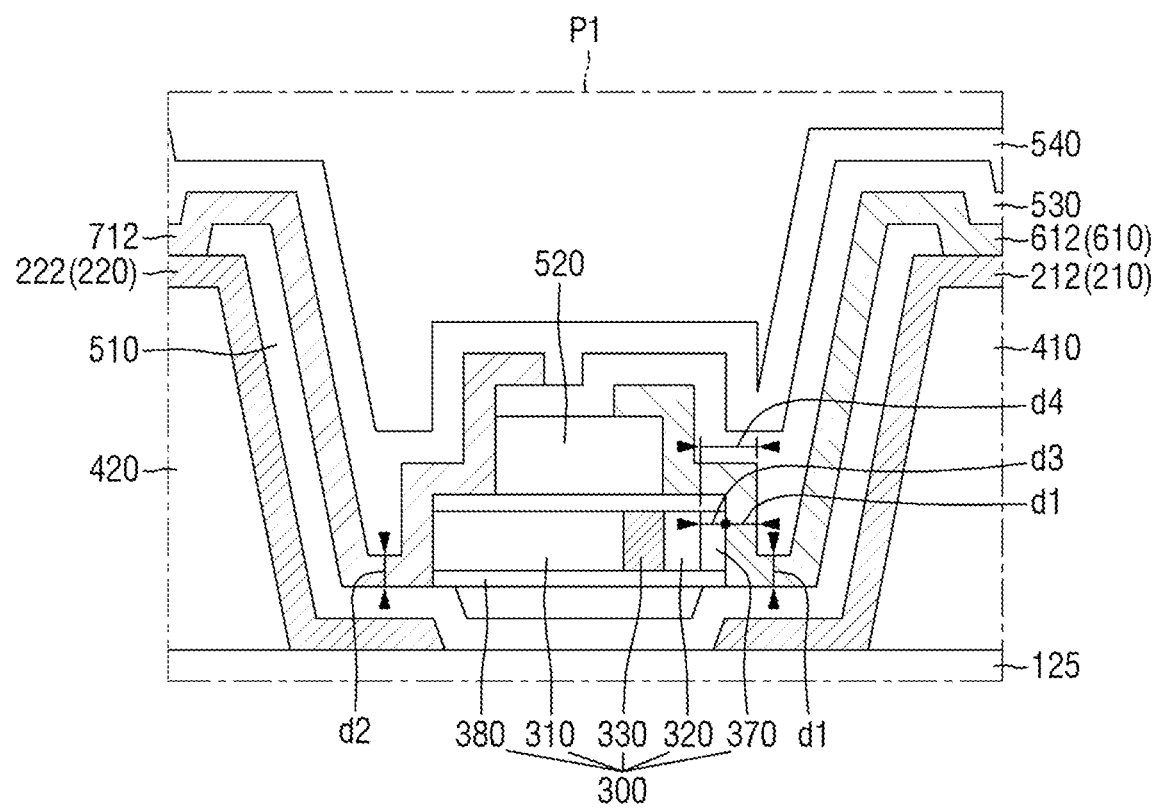
FIG. 6 is an enlarged cross-sectional view of area P1 of FIG. 4.
Figure 7:
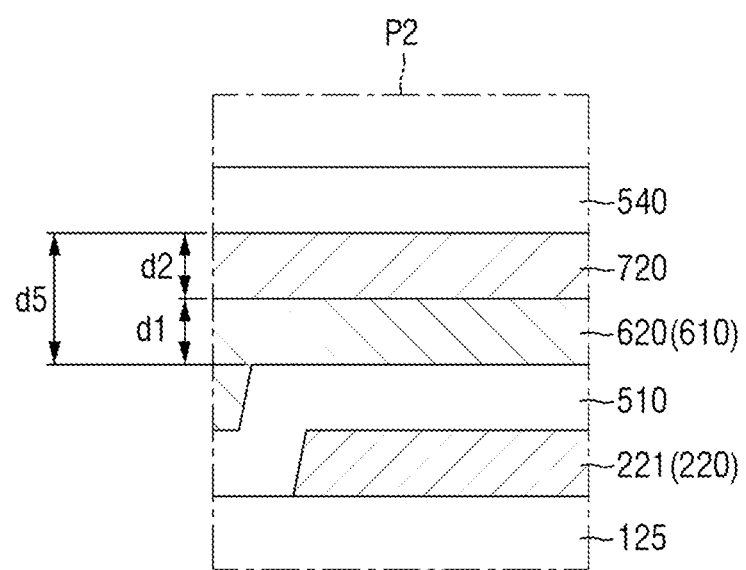
FIG. 7 is an enlarged cross-sectional view of area P2 of FIG. 4.

FIG. 6 is an enlarged cross-sectional view of area P1 of FIG. 4. FIG. 7 is an enlarged cross-sectional view of area P2 of FIG. 4.

Referring to FIGS. 6 and 7 in conjunction with FIGS. 4 and 5, the third contact electrode 610 may be formed on the first insulating layer 510 with a first thickness d1. In an exemplary embodiment where the first and second contact electrodes 711 and 712 and the first pattern 720 are formed on the same layer, each of the first and second contact electrodes 711 and 712 and the first pattern 720 may be formed on the third insulating layer 530 with a second thickness d2. In the following description, the thickness of each of the contact electrodes 711, 712 and 610 may refer to the average distance from a surface (hereinafter referred to as lower surface) of each of the contact electrodes 711, 712 and 610 in contact (e.g., physical contact) with the element thereunder to the opposite surface (hereinafter referred to as upper surface).

Referring to FIG. 6, the first contact electrode 711, the second contact electrode 712, and the first and second areas 611 and 612 of the third contact electrode 610 in the contact area CA may be in contact (e.g., physical contact) with both ends of the light-emitting element 300. The transmittance of the light that is generated in the active layer 360 of the light-emitting element 300 and is output through both ends of the light-emitting element 300 may be different depending on the first and third thicknesses d1 and d2 of the first contact electrode 711, the second contact electrode 712, and the first and second areas 611 and 612 of the third contact electrode 610 in the contact area CA in contact (e.g., physical contact) with both ends of the light-emitting element 300.

In addition, the transmittance of the light generated in the active layer 360 of the light-emitting element 300 may be determined based on a fourth thickness d4 that is the sum of the third thickness d3 of the element electrode layer 370 included in the light-emitting element 300 and the first thickness d1 of the third contact electrode 610 in the contact area CA. As the first thickness d1, the second thickness d2 and the third thickness d4 increase, the transmittance of light generated in the light-emitting element 300 and exiting to the outside of the light-emitting element 300 may decrease. Accordingly, in order to increase the transmittance of light generated and emitted by the light-emitting element 300 in the contact area CA and also to transmit the electric signal in the line area LA as described above, the thicknesses of the first and second contact electrodes 711 and 712, the third contact electrode 610 and the first pattern 720 may be determined suitably or appropriately. In an exemplary embodiment, the thickness d1 of the third contact electrode 610 may be in, but is not limited to, a range of 150 Å to 1,000 Å. Likewise, the thickness d2 of the first and second contact electrodes 711 and 712 may be in, but is not limited to, a range of 150 Å to 1,000 Å.

Referring to FIG. 7, the third contact electrode 610 in the line area LA, e.g., the third area 620 of the third contact electrode 610 may be in direct contact (e.g., physical contact) with the first pattern 720 in the line area LA. As described above, the electrical signal transferred from the first electrode 211 to the first area 611 of the third contact electrode 610 through the first light-emitting element 300 may be transmitted to the second area 612 of the third contact electrode 610 through the third area 620 of the third contact electrode 610 in the line area LA. Therefore, it is necessary for the conductive layer in the line area LA, to which the electrical signal is transmitted, to have a low resistance. Accordingly, by providing the lower surface of the first pattern 720 having the second thickness d2 directly on the surface of the third area 620 of the third contact electrode 610 having the first thickness d1 in the line area LA, it is possible to reduce the resistance of the lines in the line area LA. For example, the first pattern 720 is patterned and further on the third contact electrode 610 in the line area LA, and accordingly the thickness d5 of the conductive layer in the line area LA that transmits the electrical signal may be equal to the sum of the first thickness d1 and the second thickness d2. As a result, the thickness of the conductive layer can be increased compared to a conductive layer when only the third contact electrode 610 is in the line area LA, so that the resistance can be reduced.

According to an exemplary embodiment, the third contact electrode 610 may include crystalline ITO. As the third contact electrode 610 includes the crystalline ITO, the transmittance of light generated and emitted from the light-emitting element 300 can be increased, compared to a third contact electrode including amorphous ITO. As a result, the luminance of the display device 10 can be increased.

Hereinafter, a process of fabricating the display device 10 according to an exemplary embodiment will be described with reference to FIGS. 8 to 20.

Figure 8:
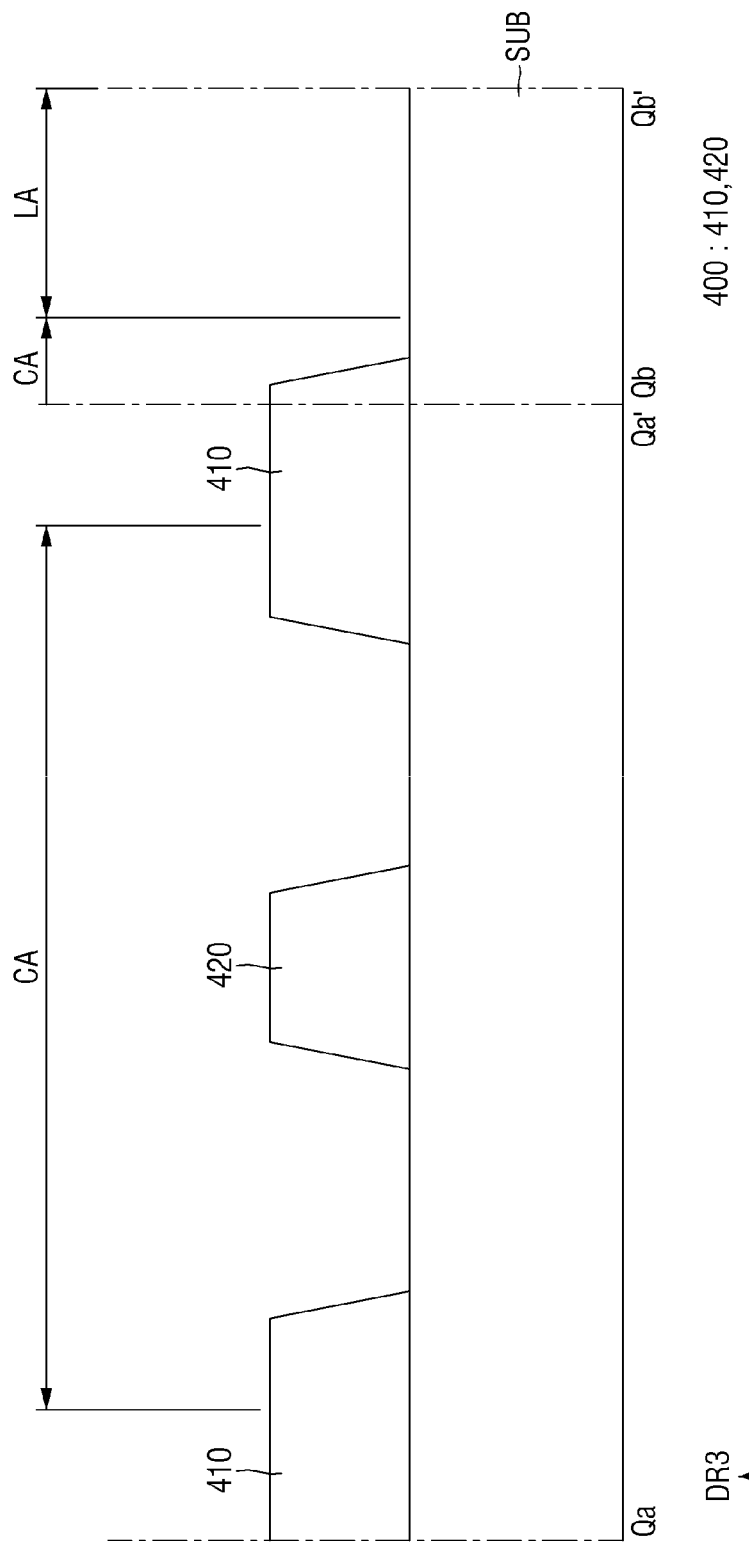
FIGS. 8 and 9 are cross-sectional views showing some processing steps of fabricating a display device according to an exemplary embodiment of the present disclosure.
Figure 9:
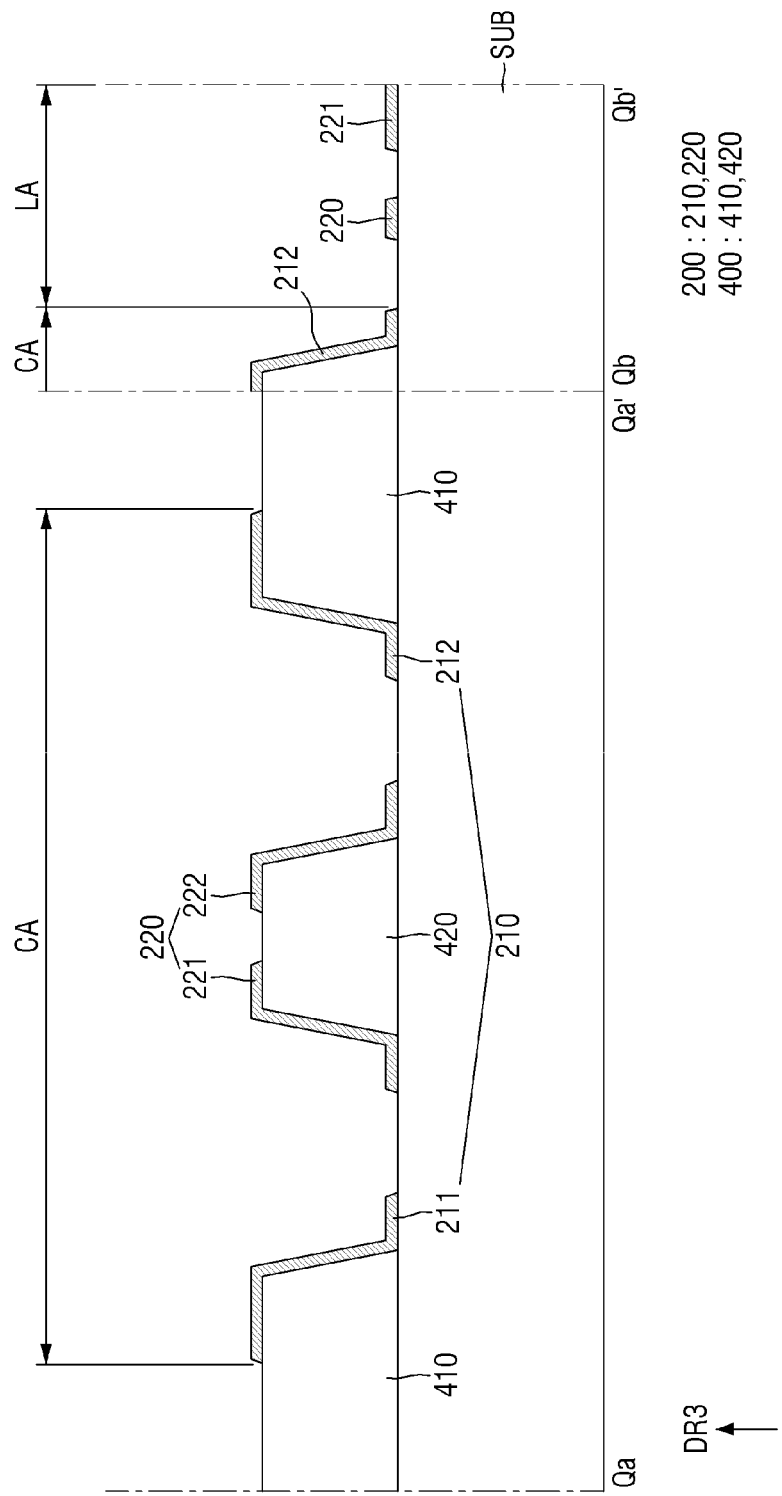
Figure 10:
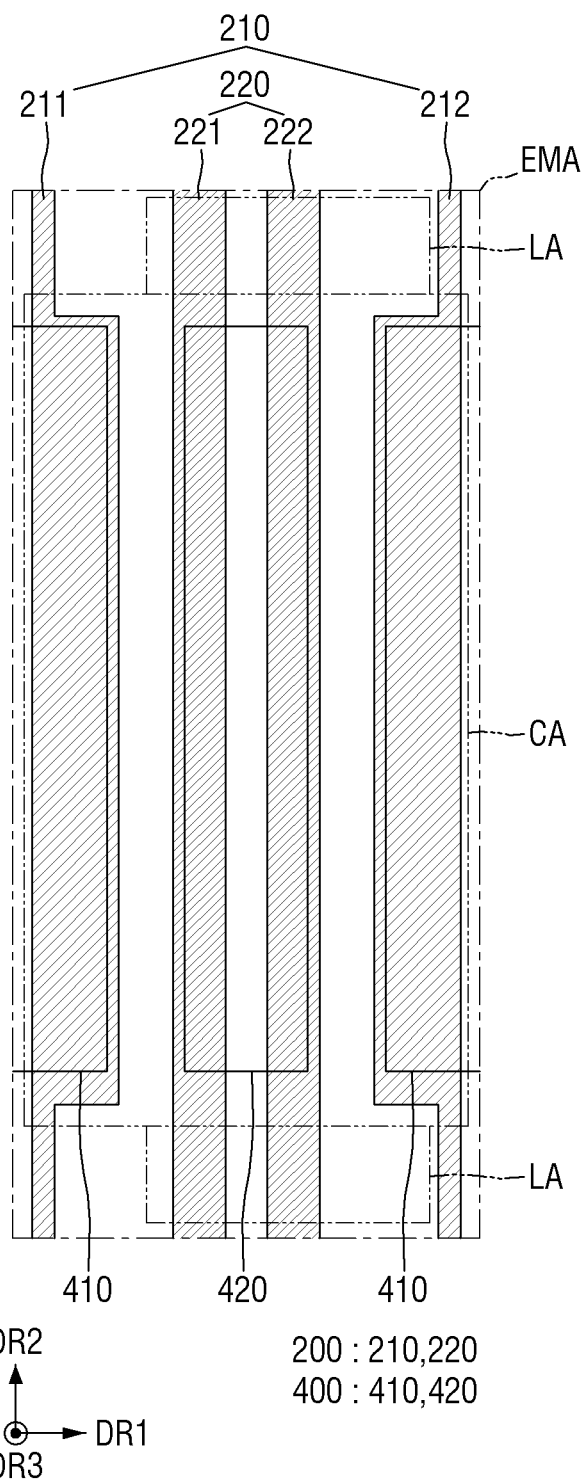
FIG. 10 is a plan view showing an emission area of a pixel during the fabricating process of FIGS. 8 and 9.

FIGS. 8 and 9 are cross-sectional views showing some processing steps of fabricating a display device according to an exemplary embodiment of the present disclosure. FIG. 10 is a plan view showing an emission area of a pixel during the fabricating process of FIGS. 8 and 9.

Initially, a target substrate SUB is prepared. In the following description, the target substrate SUB may have substantially the same cross sectional structure as the circuit element layer PAL including the substrate 110 and the plurality of conductive layers and the plurality of insulating layers on the substrate 110 shown in FIG. 4. In the following description, for convenience of illustration, the circuit element layer PAL is depicted as the target substrate SUB and its cross-sectional structure does not need to be further described here.

Subsequently, referring to FIGS. 8 and 10, a first bank 400 is formed on the target substrate SUB. The first bank 400 may include a first sub-bank 410 and a second sub-bank 420. The first bank 400 may have a shape that protrudes from the upper surface of the target substrate SUB. The description thereon has already been given above.

Subsequently, referring to FIGS. 9 and 10, the electrode layer 200 is formed on the first sub-bank 410 and the second sub-bank 420. The electrode layer 200 forms a first electrode layer 210 on the first sub bank 410 and a second electrode layer 220 on the second sub bank 420. The first electrode layer 210 may include a first electrode 211 and a first electrode pattern 212 that are symmetrical to each other with respect to a line that extends through the central portion of the emission area EMA and that extends in the second direction DR2. The second electrode layer 220 may include a second electrode 222 and a second electrode pattern 221 that are symmetrical to each other with respect to a line that passes through the central portion of the emission area EMA and that extends in the second direction DR2. The first electrode 211, the first electrode pattern 212, the second electrode 222 and the second electrode pattern 221 may include the same (e.g., substantially the same) material and may be formed together via the same (e.g., substantially the same) process.

The first electrode 211, the first electrode pattern 212, the second electrode 222, and the second electrode pattern 221 may extend in the second direction DR2 and may be spaced apart from each other in the first direction DR1. The electrode layer 200 may be formed by patterning the first electrode 211, the second electrode pattern 221, the second electrode 222 and the first electrode pattern 212 so that they are sequentially arranged from left to right when viewed from the top.

In some embodiments, referring to FIG. 3, the first electrode layer 210 may extend along the second direction DR2 without being cut in the cut area CBA. The first electrode 211 and the first electrode pattern 212 that extend in the second direction DR2 may respectively receive a voltage from the pads. The second electrode layer 220 may further include an area that electrically couples between the second electrode 222 and the second electrode pattern 221 in the cut area CBA. Accordingly, the first electrode 211, the first electrode pattern 212 and the second electrode layer 220 may receive respective voltages from the pads. After the light-emitting elements 300 are arranged and aligned in a subsequent process, the first electrode 211, the second electrode pattern 221, the second electrode 222, and the first electrode pattern 212 are separated from those of another pixel PX adjacent to the pixel PX in the second direction DR2 in the cut area CBA, such that the first electrode layer 210 and the second electrode 220 can form the electrode layer 200 shown in FIG. 2.

Figure 11:
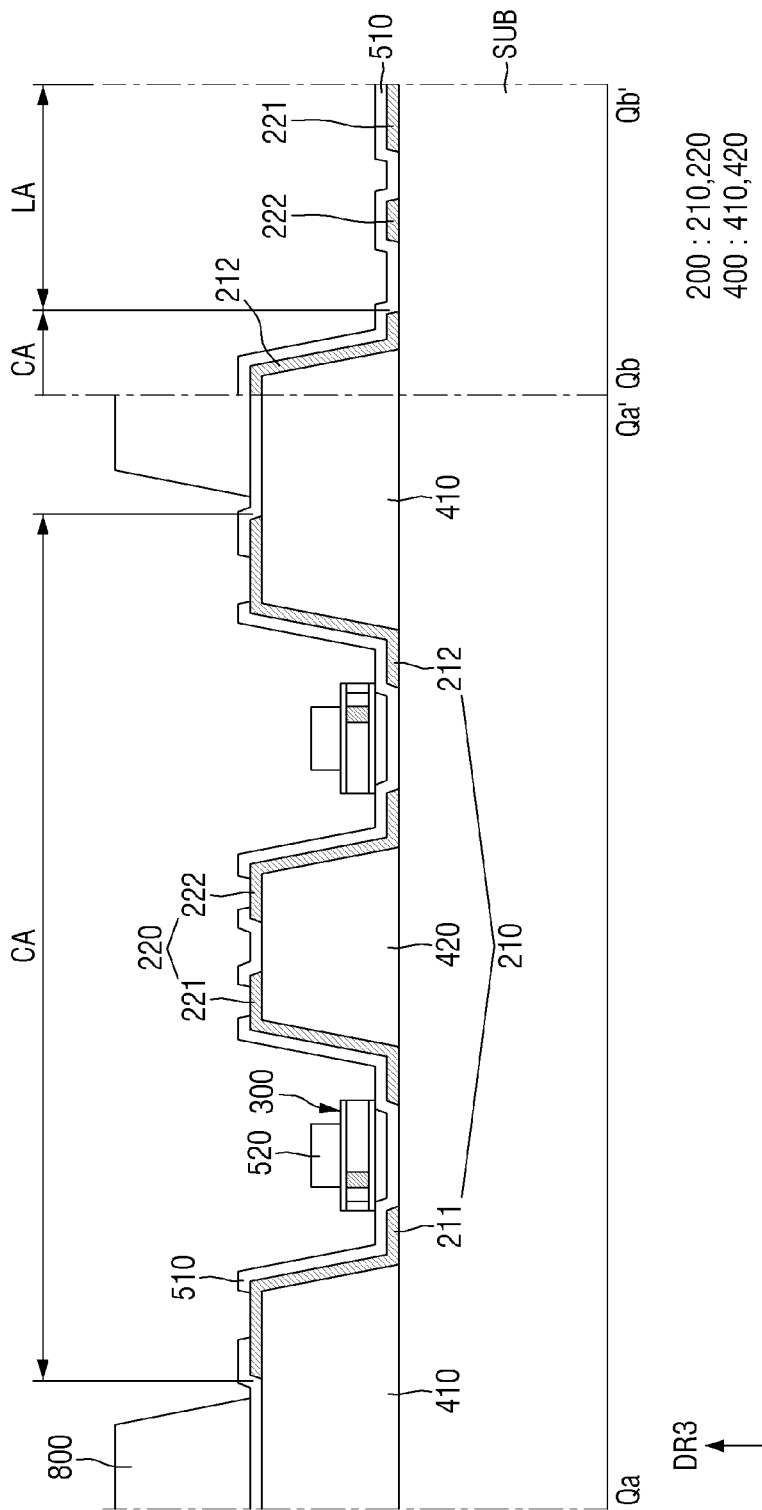
FIG. 11 shows a cross-sectional view showing a part of processing steps of fabricating a display device according to an exemplary embodiment of the present disclosure.
Figure 12:
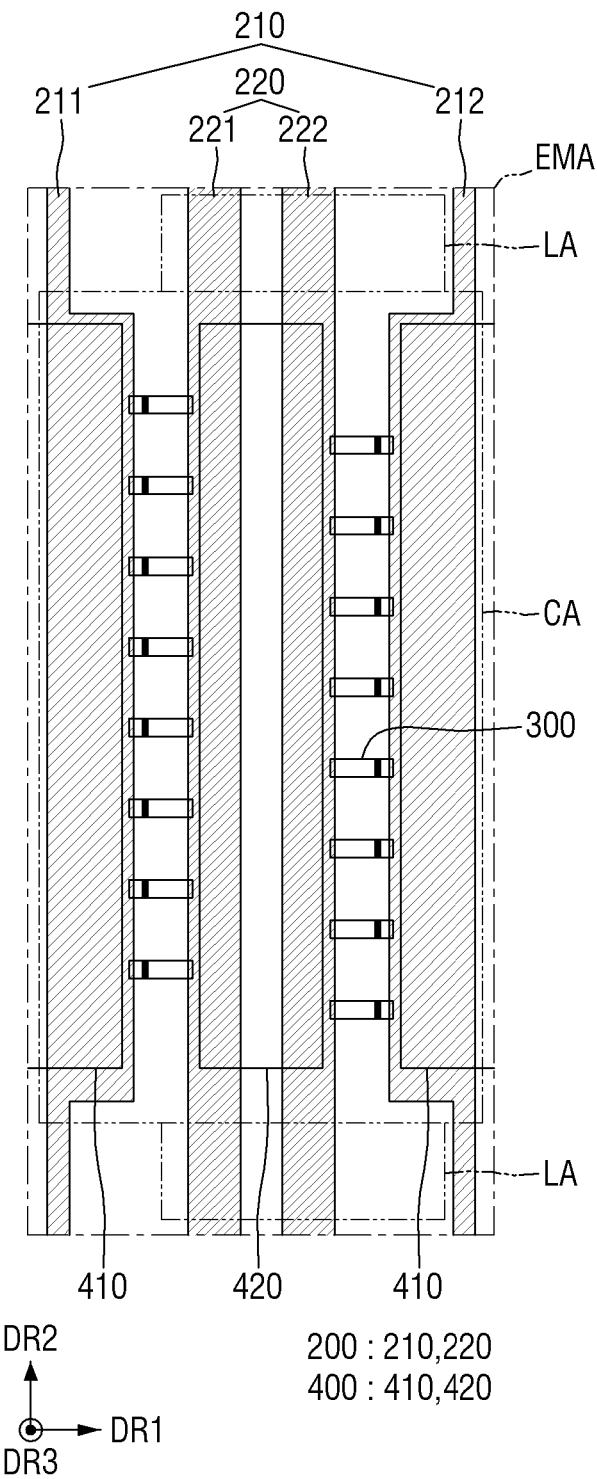
FIG. 12 is a plan view showing the emission area of the pixel during the fabricating process of FIG. 11.

FIG. 11 is a cross-sectional view showing a part of processing steps of fabricating a display device according to an exemplary embodiment of the present disclosure. FIG. 12 is a plan view showing the emission area of the pixel during the fabricating process of FIG. 11.

Subsequently, referring to FIGS. 11 and 12, a first insulating layer 510, a plurality of light-emitting devices 300, and a second insulating layer 520 are formed on the electrode layer 200.

For example, the first insulating layer 510 covering the electrode layer 200 is formed over the target substrate SUB on which the first bank 400 and the electrode layer 200 are formed.

In the contact area CA, the first insulating layer 510 exposes at least a part each of the first electrode 211, the second electrode pattern 221, the second electrode 222, and the first electrode pattern 212, and may be between the first electrode 211 and the second electrode pattern 221, between the second electrode pattern 221 and the second electrode 222, and between the second electrode 222 and the first electrode pattern 212. The first insulating layer 510 may insulate the first electrode 211, the second electrode pattern 221, the second electrode 222, and the first electrode pattern 212 from one another.

In the line area LA, the first insulating layer 510 may be entirely on the target substrate SUB. In the line area LA, the first insulating layer 510 may cover the second electrode layer 220 overlapping the line area LA.

Subsequently, a second bank 800 is formed on the first insulating layer 510.

Subsequently, a plurality of light-emitting elements 300 are provided between the first sub-bank 410 and the second sub-bank 420. The plurality of light-emitting elements 300 may include first light-emitting elements 300 on the first insulating layer 510 between the first electrode 211 and the second electrode pattern 221, and second light-emitting elements 300 on the first insulating layer 510 between the second electrode 222 and the first electrode pattern 212.

The light-emitting elements 300 may be dispersed in an ink and may be sprayed onto the target substrate SUB. In an exemplary embodiment, the light-emitting elements 300 may be prepared as they are dispersed in the ink containing a solvent and may be sprayed onto the target substrate SUB via a printing process using an inkjet printing apparatus. The ink sprayed from the inkjet printing apparatus may be settled in the area surrounded by the second bank 800. The second bank 800 can prevent or reduce overflow of the ink to other adjacent pixels PX.

When the ink containing the light-emitting elements 300 is sprayed, electric signals are applied to each of the first electrode 211, the first electrode pattern 212 and the second electrode layer 220, to align the light-emitting elements 300 on the first insulating layer 510. When electric signals are respectively applied to the first electrode 211, the first electrode pattern 212, and the second electrode layer 220, an electric field may be generated between the first electrode 211 and the second electrode pattern 221, and between the second electrode 222 and the first electrode pattern 212. The light-emitting elements 300 dispersed in the ink may be subjected to a dielectrophoresis force by the electric field, and thus, the light-emitting elements 300 subjected to the dielectrophoresis force may be seated on the first insulating layer 510 while the orientations and positions are changed.

Both ends of the each of the light-emitting elements 300 may be on the electrode layers 200 on the first insulating layer 510. An orientation of the first semiconductor layers 310 of the first light-emitting elements 300 between the first electrode 211 and the second electrode pattern 221 may be different from the orientation of the first semiconductor layers 310 of the second light-emitting elements between the second electrode 222 and the first electrode pattern 212. For example, the first light-emitting elements 300 may be aligned on the first insulating layer 510 between the first electrode 211 and the second electrode pattern 221 so that the ends of the first semiconductor layers 310 of the first light-emitting elements 300 are on the second electrode pattern 221. For example, the second light-emitting elements 300 may be aligned on the first insulating layer 510 between the second electrode 222 and the first electrode pattern 212 so that the ends of the first semiconductor layers 310 of the second light-emitting elements 300 are on the second electrode pattern 222. For example, the end of each of the light-emitting elements 300 where the first semiconductor layer 310 is provided may be defined as a first end. Then, the first ends of the light-emitting elements 300 on the left side and the first ends of the light-emitting elements 300 on the right side may face opposite directions in the pixel PX when viewed from the top.

Subsequently, the second insulating layer 520 is formed on the plurality of light-emitting elements 300. The second insulating layer 520 may be formed by stacking a second insulating material layer entirely on the target substrate SUB on which the light-emitting elements 300 and the first insulating layer 510 are formed, and removing a part of the second insulating material layer so that the first ends and the other ends of the light-emitting elements 300 are exposed. The second insulating layer 520 may include openings exposing both ends of the light-emitting elements 300 and a part of the electrode layer 200. The first to third contact electrodes 711, 712, and 610 may be on both ends of the light-emitting elements 300 and the electrode layer 200 exposed through the openings.

Subsequently, a process of cutting parts of the first electrode layer 210 and the second electrode layer 220 that are in the cut area CBA is carried out, to form the first electrode 211, the second electrode pattern 221, the second electrode 222, and the first electrode pattern 121. Via the cutting process, the electric signal for aligning the light-emitting elements 300 may be applied through the electrode layers 210 and 220 coupled to the light-emitting elements PX, and the electrode layers, e.g., the first electrode 211, the second electrode pattern 221, the second electrode 222, and the first electrode pattern 212 may be separated in the cut area CBA to form electrodes, for driving the display device 10. Accordingly, the first and second electrodes 211 and 222 in each of the pixels PX can be driven individually by the transistors in each of the pixels PX.

Figure 13:
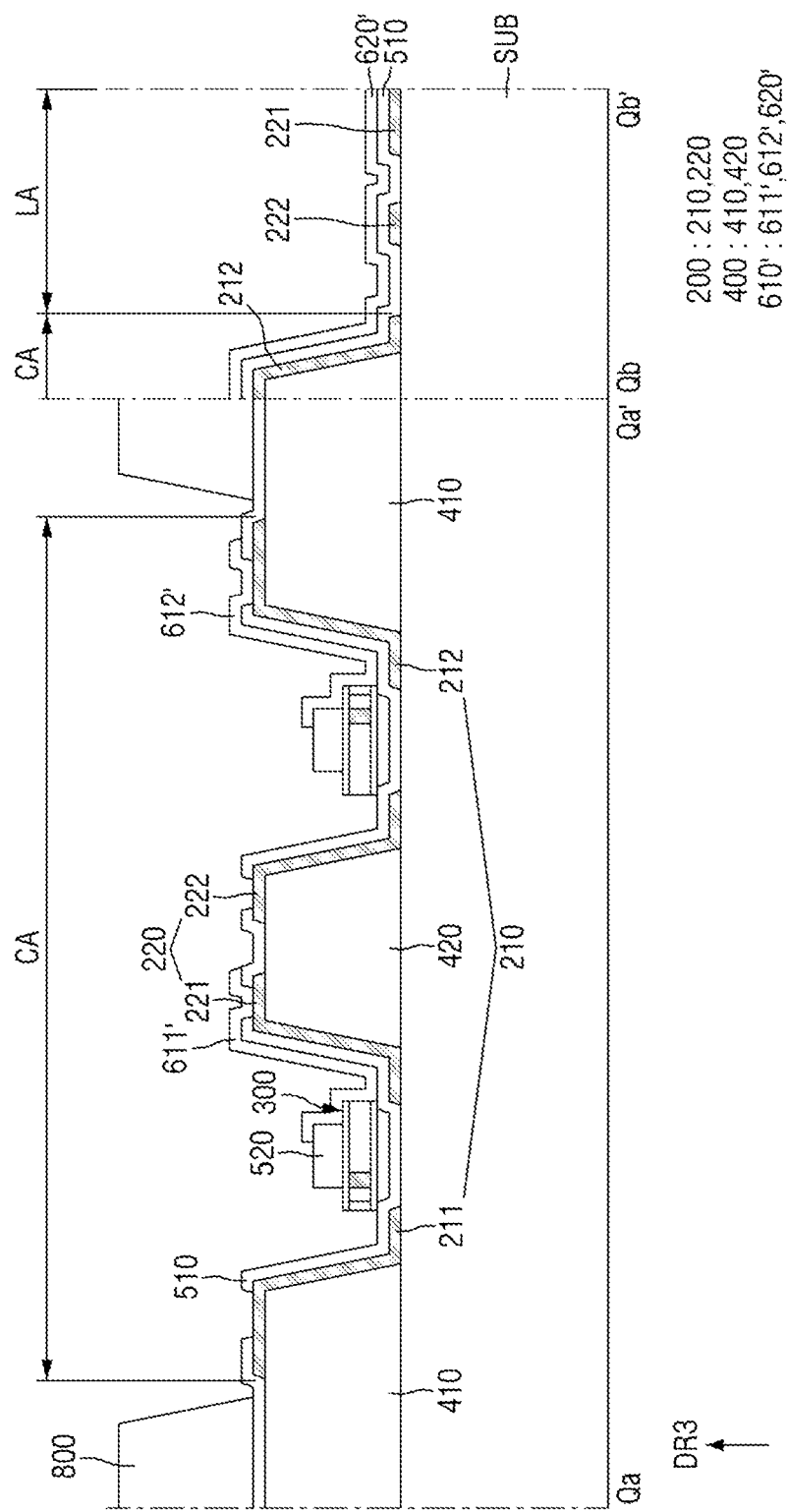
FIGS. 13 and 14 are cross-sectional views showing some processing steps of fabricating a display device according to an exemplary embodiment of the present disclosure.
Figure 14:
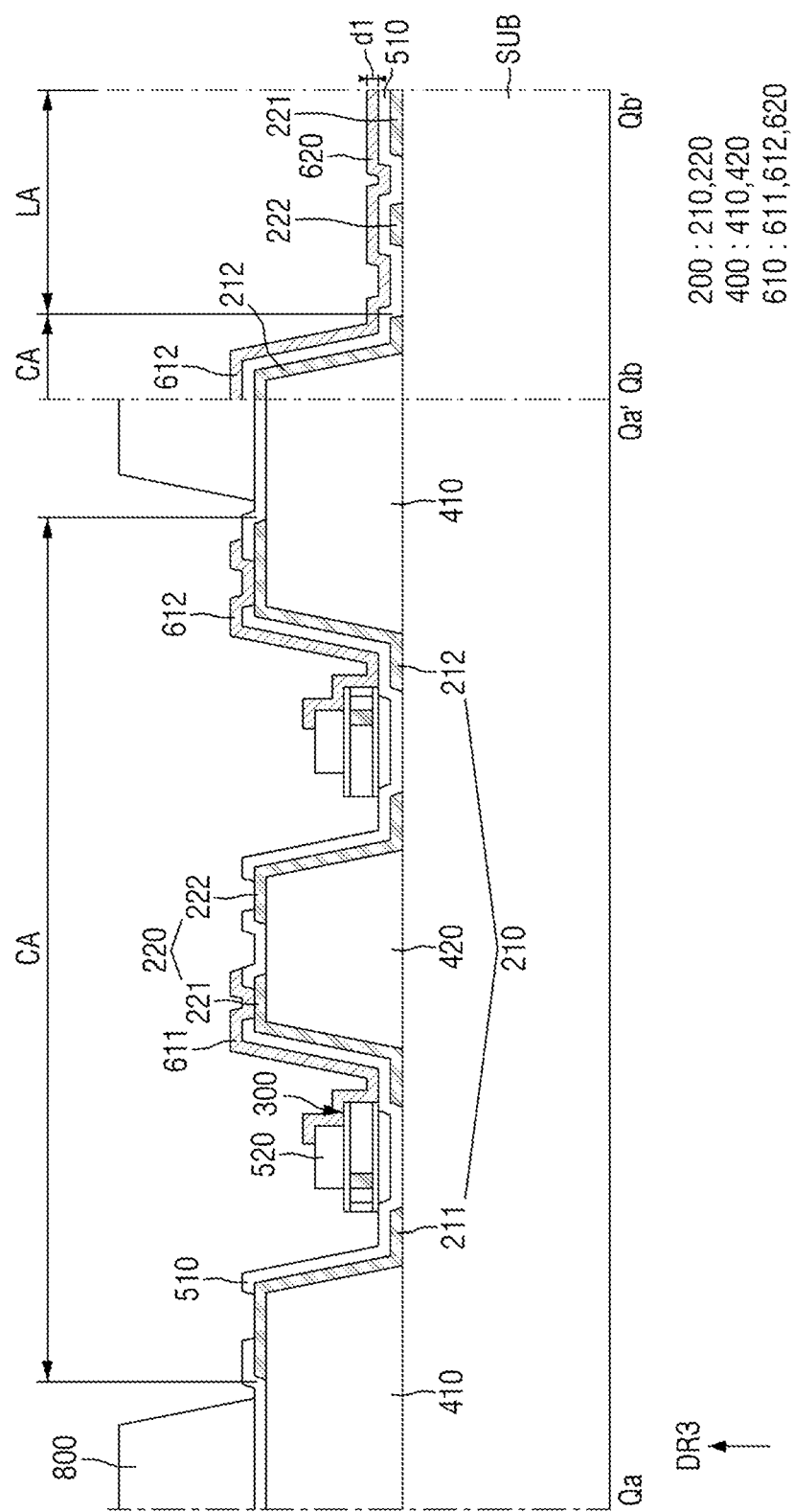
Figure 15:
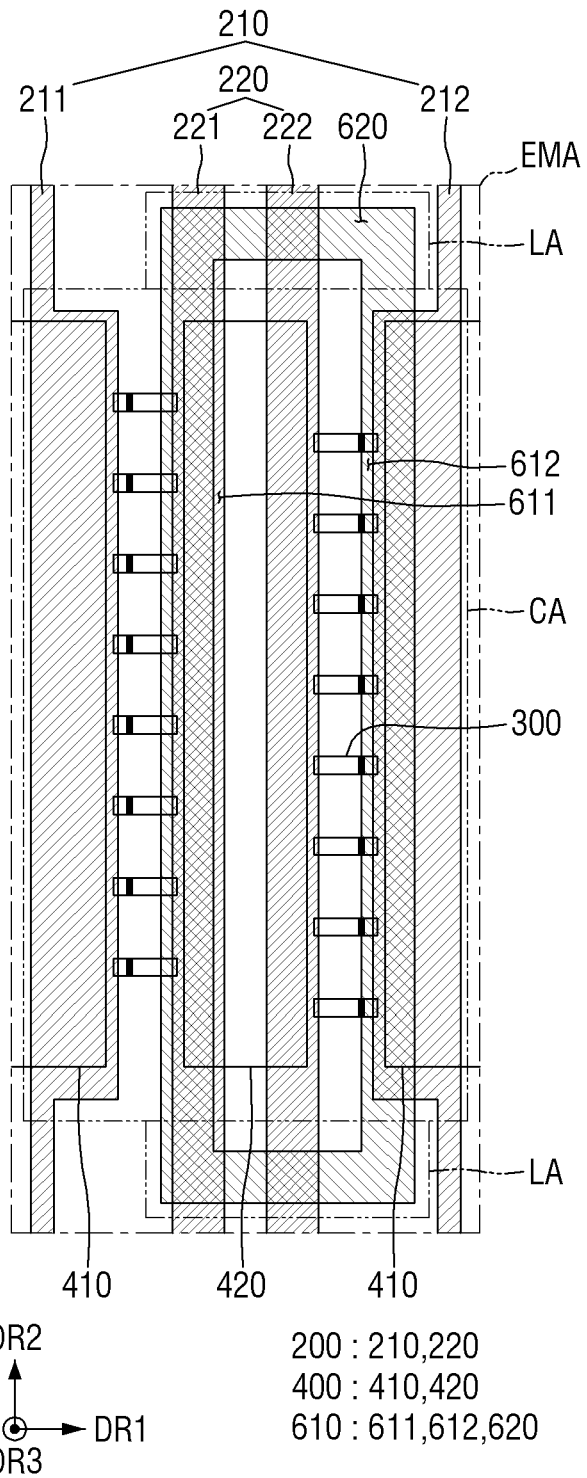
FIG. 15 is a plan view showing the emission area of the pixel during the fabricating process of FIG. 14.

FIGS. 13 and 14 are cross-sectional views showing some processing steps of fabricating a display device according to an exemplary embodiment of the present disclosure. FIG. 15 is a plan view showing the emission area of the pixel during the fabricating process of FIG. 14.

Subsequently, referring to FIG. 13, a first contact electrode material pattern 610' is formed on the electrode layer 200. In an exemplary embodiment, the first contact electrode material pattern 610' is formed on the first electrode pattern 212 and the second electrode pattern 221 of the electrode layer 200. The patterned first contact electrode material pattern 610' may be formed via the same (e.g., substantially the same) mask process. For example, a first area 611' of the first contact electrode material pattern 610' on the second electrode pattern 221 in the contact area CA, a second area 612' of the first contact electrode material pattern 610' on the first electrode pattern 212 in the contact area CA, and a third area 620' of the first contact electrode material pattern 610' on the first insulating layer 510 in the line area LA may be formed via the same (e.g., substantially the same) mask process.

In some embodiments, a first contact electrode material layer is deposited on the entire surface of the target substrate SUB. Subsequently, a photoresist layer is applied onto the first contact electrode material layer, and a photoresist pattern is formed by exposure and development. Then, etching is carried out by using it as an etch mask. Generally, the etching of the first contact electrode material layer may be performed by, but is not limited to, wet etching. Subsequently, the photoresist pattern is removed via a strip process or an ashing process. Although not limited thereto, the first contact electrode material layer may include amorphous ITO. Therefore, the first contact electrode material pattern 610' may include amorphous ITO. The thickness of the first contact electrode material pattern 610' may be in, but is not limited to, a range of 150 Å to 1,000 Å.

Subsequently, referring to FIG. 14, heat treatment may be carried out on the first contact electrode material pattern 610' formed on the target substrate SUB. The heat treatment may be carried out at a temperature of 200° C. to 270° C. for 10 minutes to 20 minutes. It is, however, to be understood that the present disclosure is not limited thereto. Amorphous ITO may be transformed into crystalline ITO by the heat treatment. Therefore, the third contact electrode 610 including crystalline ITO may be formed by the heat treatment. According to this exemplary embodiment, amorphous ITO having a higher etching selectivity than crystalline ITO with respect to the same etchant is deposited entirely as the first contact electrode material layer and an etching process is performed. Therefore, the process of patterning can become easier. Subsequently, as the third contact electrode 610 including the crystalline ITO is formed via the heat treatment process on the amorphous ITO, it is possible to prevent or reduce damage to the third contact electrode 610 by the etchant that is used to etch the material included in the first and second contact electrodes 711 and 712 and the first pattern 720. A further description thereof will be provided herein below.

Figure 16:
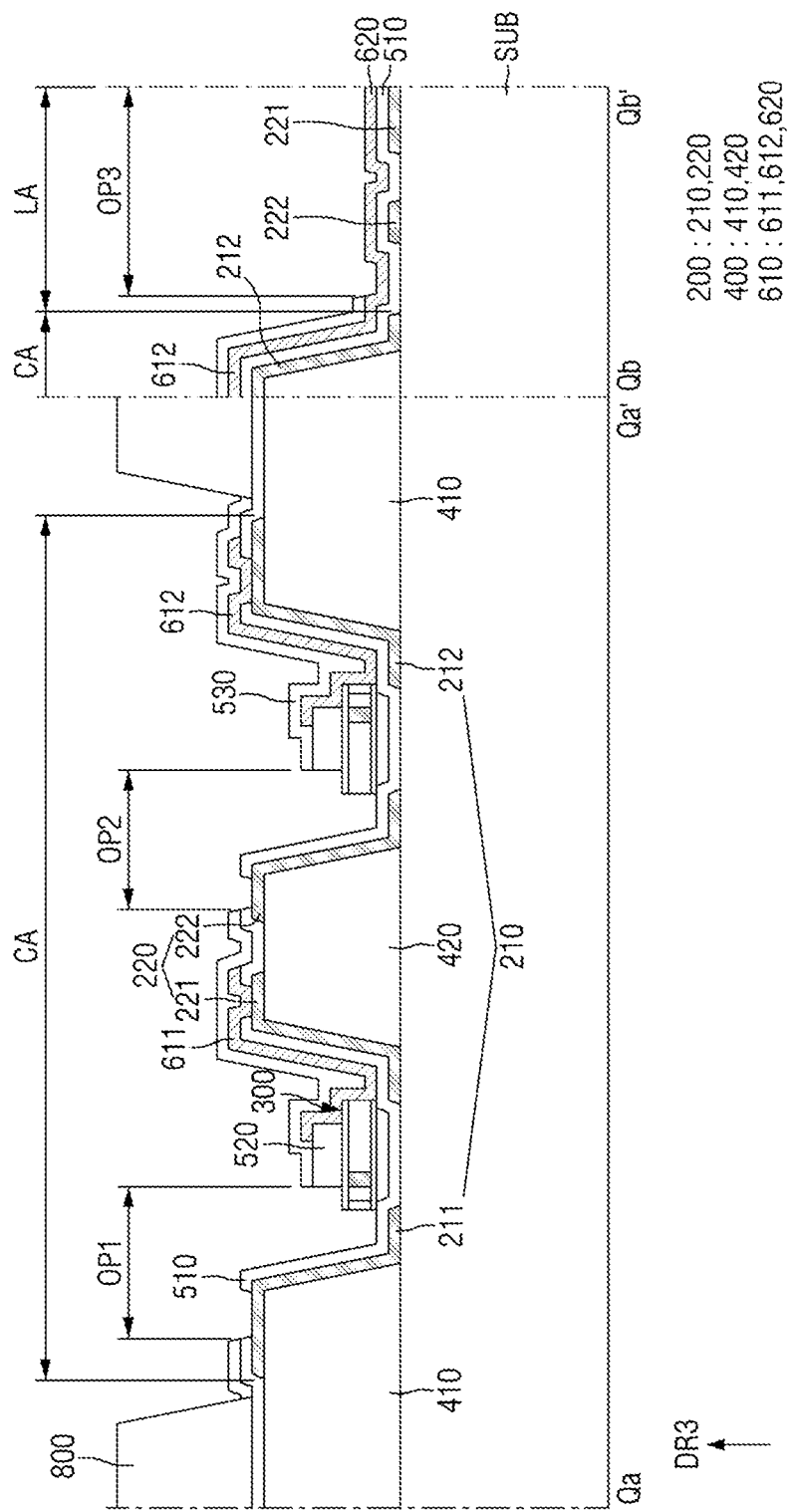
FIG. 16 shows a cross-sectional view showing a part of processing steps of fabricating a display device according to an exemplary embodiment of the present disclosure.
Figure 17:
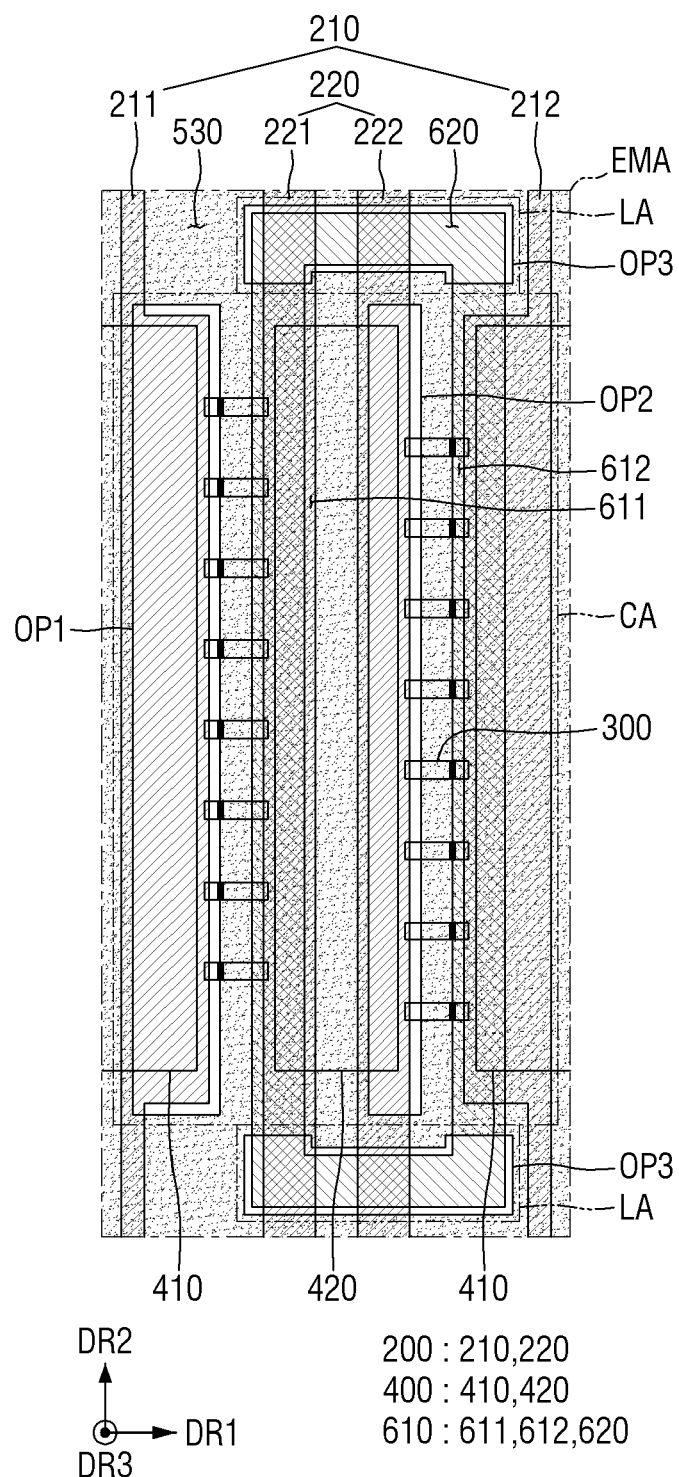
FIG. 17 is a plan view showing the emission area of the pixel during the fabricating process of FIG. 16.

FIG. 16 is a cross-sectional view showing a part of processing steps of fabricating a display device according to an exemplary embodiment of the present disclosure. FIG. 17 is a plan view showing the emission area of the pixel during the fabricating process of FIG. 16.

Subsequently, a third insulating layer 530 may be formed on the third contact electrode 610. The patterned third insulating layer 530 may be formed by depositing a material layer for the third insulating layer entirely on the target substrate SUB and forming a first opening OP1 and a second opening OP2 exposing a portion of the contact area CA and a third opening OP3 exposing a portion of the line area LA. Therefore, the third insulating layer 530, the first opening OP1, the second opening OP2 and the third opening OP3 may be formed via the same (e.g., substantially the same) mask process. For example, the third insulating layer 530 may be made of an inorganic material and/or an organic material. The third insulating layer 530 may be formed by applying a material layer for the third insulating layer and then forming the first opening OP1, the second opening OP2 and the third opening OP3 by exposure and development.

In the contact area CA, the first opening OP1 may include a part of the first electrode 211 exposed by the first insulating layer 510 and the other end of the first light-emitting element 300 (e.g., the opposite end of the light-emitting element 300 to the first end in contact (e.g., physical contact) with the first area 611 of the third contact electrode 610). The other end of the first light-emitting element 300 exposed via the first opening OP1 may be an end region of the first light-emitting element 300 exposed by the second insulating layer 520.

In the contact area CA, the second opening OP2 may include a part of the second electrode 222 exposed by the first insulating layer 510 and the other end of the second light-emitting element 300 (e.g., the opposite end of the light-emitting element 300 to the first end in contact (e.g., physical contact) with the second area 612 of the third contact electrode 610). The other end of the second light-emitting element 300 exposed via the second opening OP2 may be an end region of the second light-emitting element 300 exposed by the second insulating layer 520.

The third opening OP3 may overlap with the third area 620 of the third contact electrode 610 in the line area LA. At least a part of the third area 620 of the third contact electrode 610 in the line area LA by the third opening OP3 may be exposed in the third direction DR3.

Figure 18:
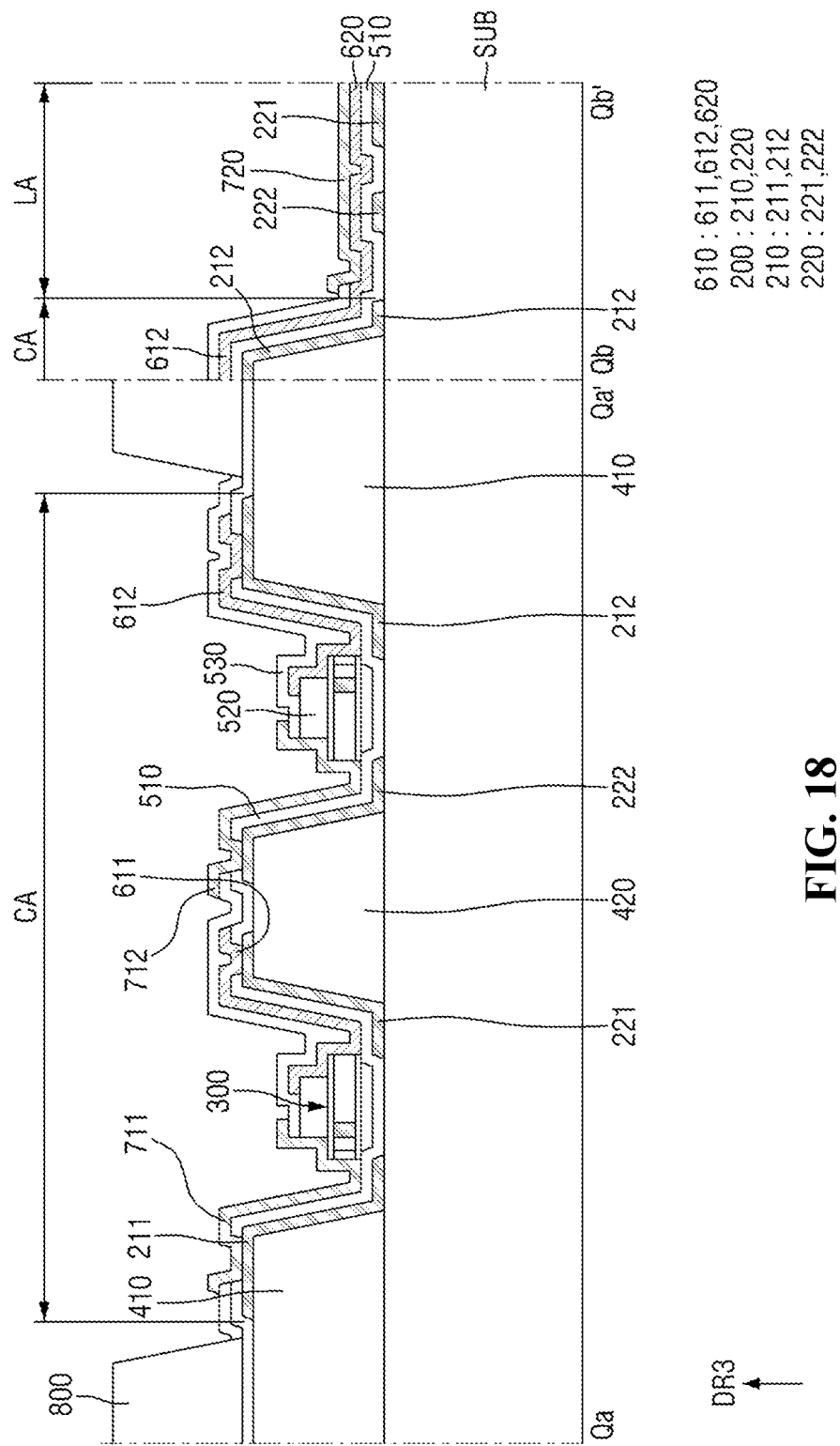
FIG. 18 shows a cross-sectional view showing a part of processing steps of fabricating a display device according to an exemplary embodiment of the present disclosure.
Figure 19:
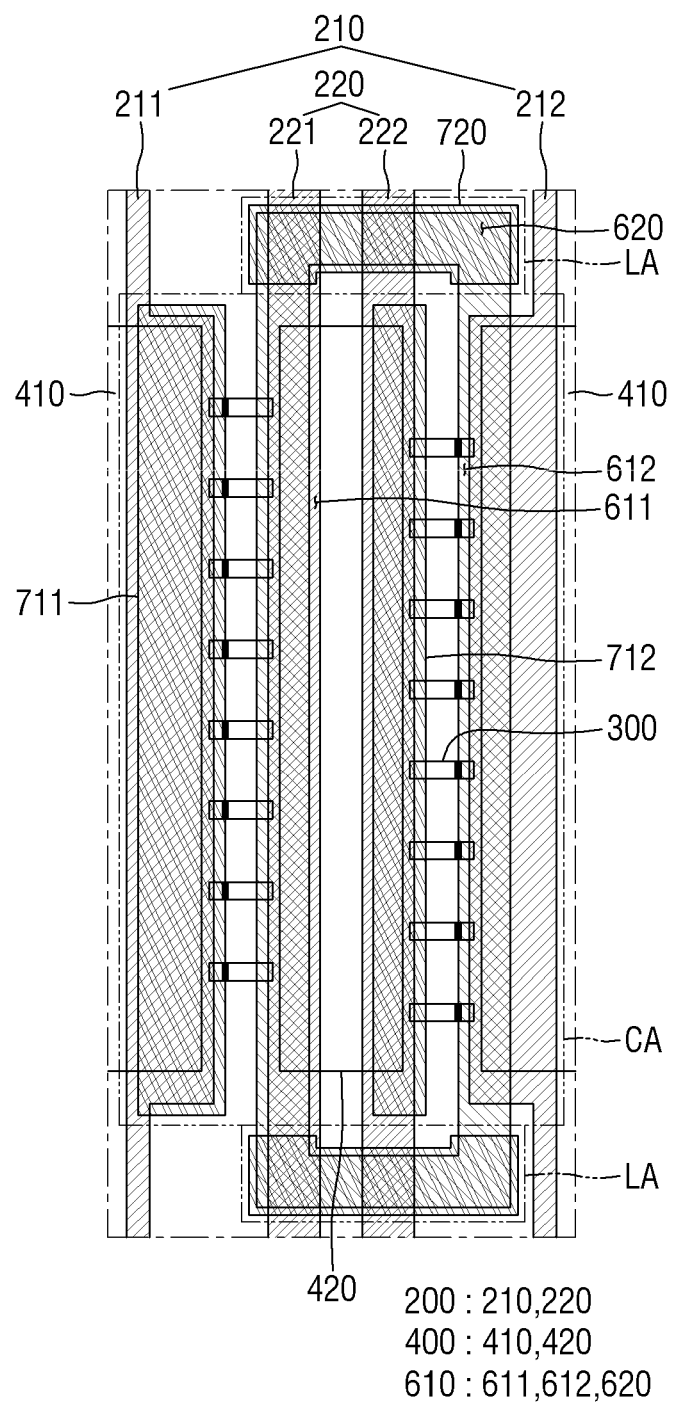
FIG. 19 is a plan view showing the emission area of the pixel during the fabricating process of FIG. 18.

FIG. 18 is a cross-sectional view showing a part of processing steps of fabricating a display device according to an exemplary embodiment of the present disclosure. FIG. 19 is a plan view showing the emission area of the pixel during the fabricating process of FIG. 18.

Subsequently, the first contact electrode 711, the second contact electrode 712, and the first pattern 720 are formed on the third insulating layer 530. The first contact electrode 711 on the first electrode 211 in line with the first opening OP1 in the contact area CA, the second contact electrode 712 on the second electrode 222 in line with the second opening OP2 in the contact area CA, and the first pattern 720 on the third area 620 of the third contact electrode 610 in line with the third opening OP3 in the line area LA may be formed via the same (e.g., substantially the same) mask process.

In some embodiments, a second contact electrode material layer is deposited on the entire surface of the target substrate SUB. Subsequently, a photoresist layer is applied onto the second contact electrode material layer, and a photoresist pattern is formed by exposure and development. Then, etching is carried out by using it as an etch mask. Generally, the etching of the second contact electrode material layer may be performed by, but is not limited to, wet etching. Subsequently, the photoresist pattern is removed via a strip process or an ashing process. Although not limited thereto, the second contact electrode material layer may include amorphous ITO and/or crystalline ITO. The thickness of each of the first contact electrode 711, the second contact electrodes 712 and the first pattern 720 may be in, but is not limited to, a range of 150 Å to 1,000 Å.

According to this exemplary embodiment, the third contact electrode 610 includes the crystalline ITO via the heat treatment process for crystallizing the amorphous ITO into the crystalline ITO in the process of forming the third contact electrode 610 as described above, and thus, it is possible to prevent or reduce damage to the third contact electrode 610 by an etchant during the etching process for forming the first contact electrode 711, the second contact electrode 712 and the first pattern 720.

In some embodiments, the third insulating layer 530 may be on the first area 611 and the second area 612 of the third contact electrode 610 in the contact area CA. Accordingly, the first area 611 and the second area 612 of the third contact electrode 610 in the contact area CA are not exposed to the etchant by the third insulating layer 530 covering them, and thus, it is possible to prevent or reduce damage to the first area 611 and the second area 612 of the third contact electrode 610.

In some embodiments, the third insulating layer 530 may not be on the third area 620 of the third contact electrode 610 in the line area LA, as described above. For example, the third insulating layer 530 is not on the third contact electrode 610, e.g., the third area 620 in the line area LA, so that the third area 620 may be exposed by the third insulating layer 530 in the third direction DR3. Incidentally, as described above, the third area 620 may include crystalline ITO via a heat treatment process. According to this exemplary embodiments, even though the third area 620 is exposed in the third direction DR3 as the third insulating layer 530 is not on it, the third area 620 may not be etched during the process of forming the first pattern 720 even if it is exposed to the etchant for etching amorphous ITO because the third area 620 includes the crystalline ITO. Thus, although the third contact electrode 610 and the first pattern 720 (or the first and second contact electrodes 711 and 712) contain the same (e.g., substantially the same) material (e.g., ITO) and are exposed to the etchant in each etching process, it is possible to prevent or reduce damage to the third contact electrode 610 and the first pattern 720 (or the first and second contact electrodes 711 and 712) by the etchant because the third area 620 of the third contact electrode 610 in the line area LA includes the crystalline ITO.

Figure 20:
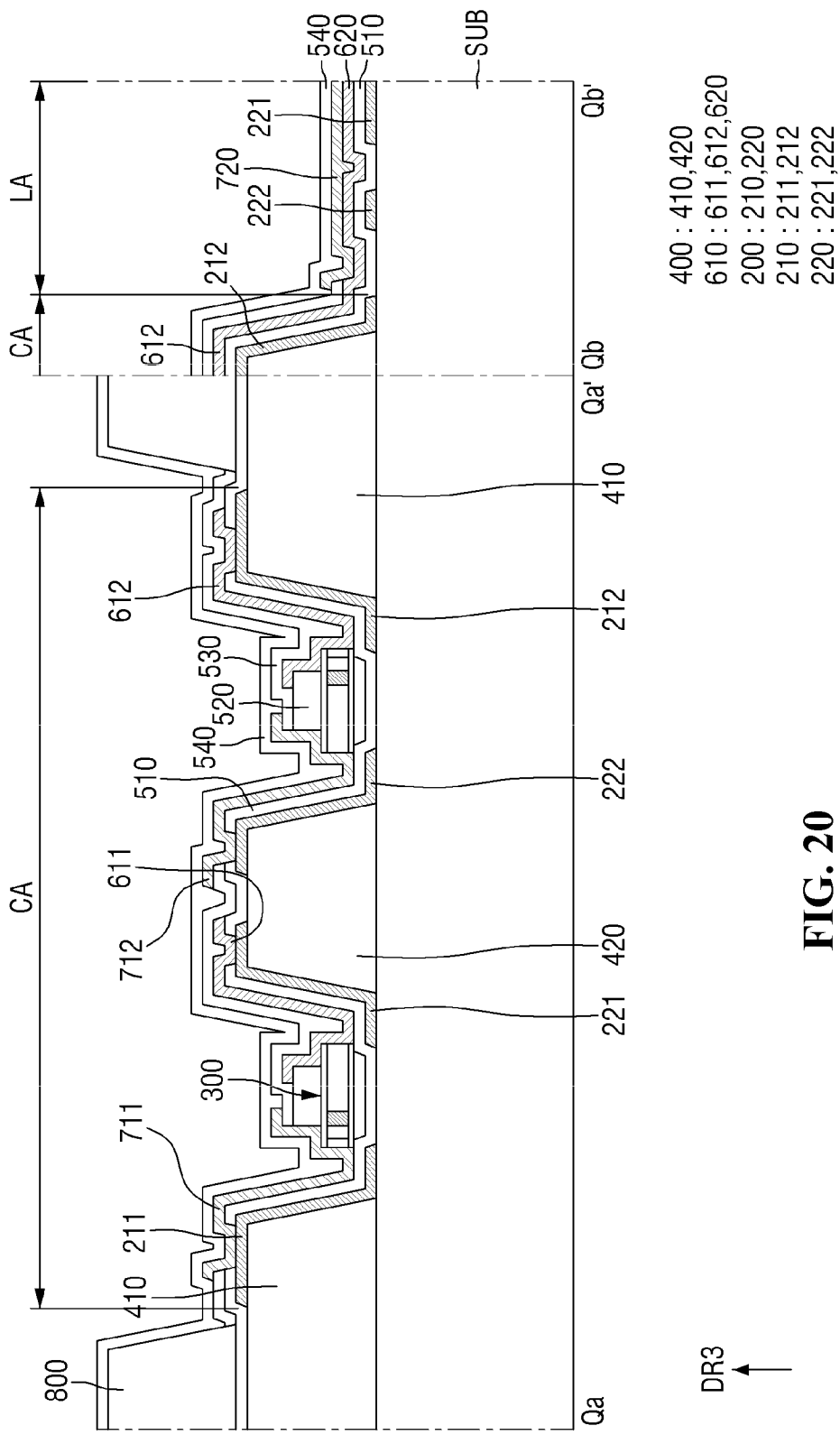
FIG. 20 shows a cross-sectional view showing a part of processing steps of fabricating a display device according to an exemplary embodiment of the present disclosure.

FIG. 20 is a cross-sectional view showing a part of processing steps of fabricating a display device according to an exemplary embodiment of the present disclosure.

Subsequently, referring to FIG. 20, a fourth insulating layer 540 is formed entirely on the target substrate SUB. The fourth insulating layer 540 may be formed to completely cover the elements on the target substrate SUB. According to an exemplary embodiment, the fourth insulating layer 540 may completely cover the second bank 800, the third insulating layer 530, the first to third contact electrodes 712, 712 and 610 and the first pattern 720 on the target substrate SUB.

Hereinafter, display devices according to other exemplary embodiments of the present disclosure will be described with reference to the remaining drawings.

Figure 21:
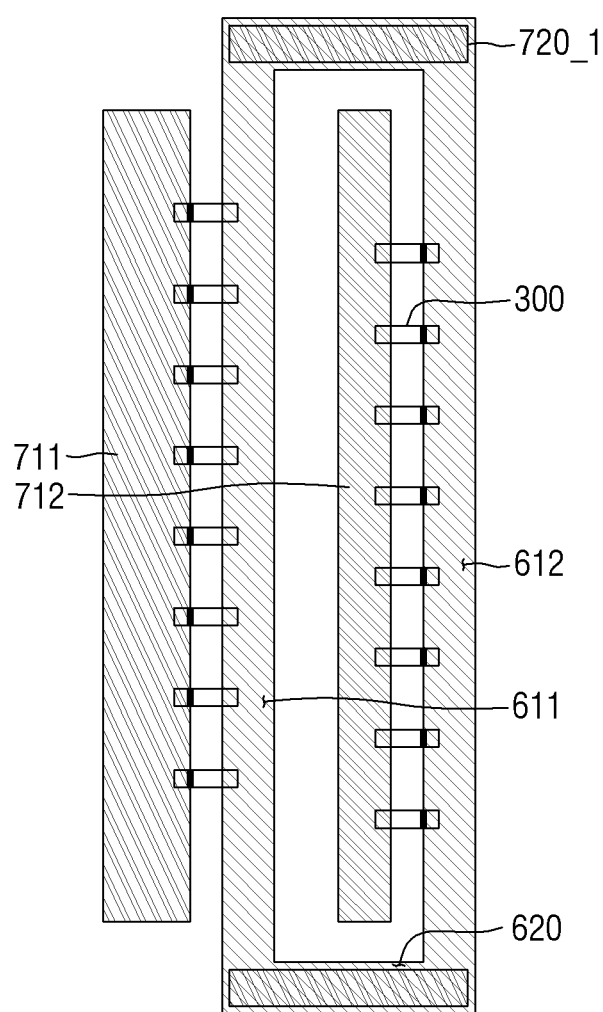
FIG. 21 is a plan view showing a layout for illustrating relative arrangement relationship of light-emitting elements, a plurality of contact electrodes, and a first pattern according to another exemplary embodiment.

FIG. 21 is a plan view showing a layout for illustrating relative arrangement relationships of light-emitting elements, a plurality of contact electrodes, and a first pattern according to another exemplary embodiment.

A display device 10 according to the exemplary embodiment of FIG. 21 is different from the display device according to the exemplary embodiment of FIG. 3 in that the lengths of a first pattern 720_1 in the first direction DR1 and the second direction DR2 may be smaller than the lengths of a third area 620 of a third contact electrode 610 in the first direction DR1 and the second direction DR2.

In some embodiments, the first pattern 720_1 may be on the third area 620. The first pattern 720_1 may overlap the third area 620 of the third contact electrode 610 in the third direction DR3, and may be on the third area 620 of the third contact electrode 610 such that the edge of the third area 620 of the third contact electrode 610 is exposed. The first pattern 720_1 may not overlap with the first area 611 and the second area 612 of the third contact electrode 610.

The first pattern 720_1 may have a rectangular shape including longer sides in the first direction DR1 and shorter sides in the second direction DR2 when viewed from the top. The length of the first pattern 720_1 in the first direction DR1 may be smaller than the length of the third area 620 of the third contact electrode 610 in the first direction DR1. The length of the first pattern 720_1 in the second direction DR2 may be smaller than the length of the third area 620 of the third contact electrode 610 in the second direction DR2. For example, the area of the first pattern 720_1 may be smaller than the area of the third area 620 of the third contact electrode 610 that it overlaps, so that the third area 620 of the third contact electrode 610 may completely cover the first pattern 720_1 from the below. The lower surface of the first pattern 720_1 may be in direct contact (e.g., physical contact) with the upper surface of the third area 620 of the third contact electrode 610 and not with the upper surface of each of the first area 611 and the second area 612 of the third contact electrode 610.

According to this exemplary embodiment, although the first pattern 720_1 is only on the third area 620 of the third contact electrode 610, the thickness d5 of the conductive layer in the line area LA that transmits the electric signal (see FIG. 6) may be equal to the sum of the thickness d1 (see FIG. 6) of the third area 620 of the third contact electrode 610 and the thickness d2 (see FIG. 6) of the first pattern 720_1. For example, the thickness d5 of the conductive layer in the line area LA (see FIG. 6) is larger than the thickness d1 or d2 of the contact electrode in contact (e.g., physical contact) with the first ends of the light-emitting elements 300 in the contact area CA (see FIG. 5), and thus, the resistance of the conductive layer in the line area LA can be reduced. In addition, as the first pattern 720_1 is formed smaller than the area of the third area 620 of the third contact electrode 610 when viewed from the top, the first pattern 720_1 is only on the third area 620 of the third contact electrode 610. As a result, the material cost of the first pattern 720_1 can be saved or reduced.

Figure 22:
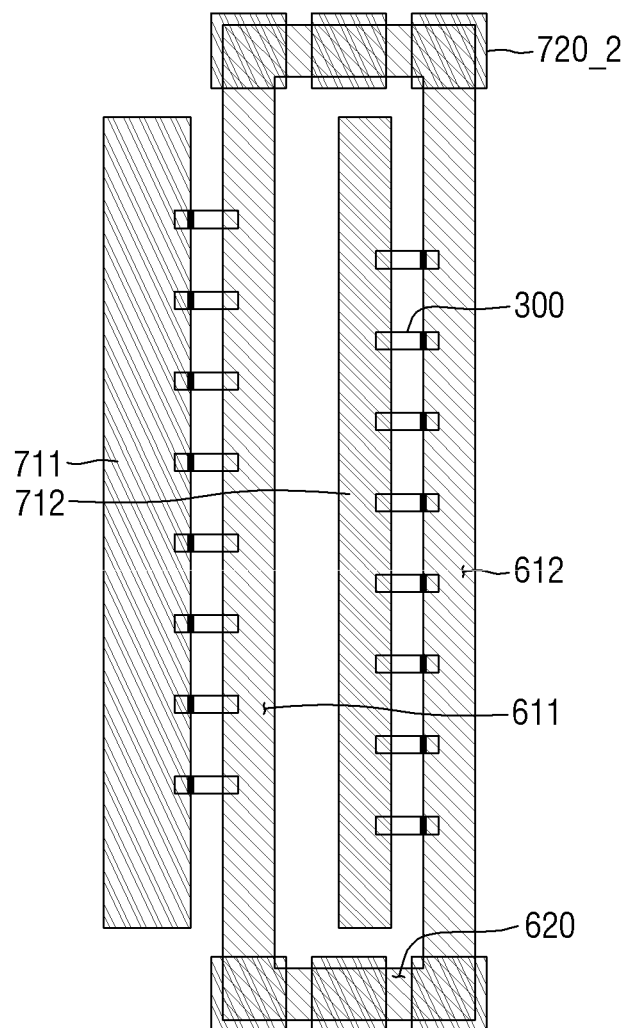
FIG. 22 is a plan view showing a layout for illustrating relative arrangement relationship of light-emitting elements, a plurality of contact electrodes, and a first pattern according to yet another exemplary embodiment.

FIG. 22 is a plan view showing a layout for illustrating relative arrangement relationships of light-emitting elements, a plurality of contact electrodes, and a first pattern according to yet another exemplary embodiment.

A display device 10 according to the exemplary embodiment of FIG. 22 is different from the display device according to the exemplary embodiment of FIG. 3 in that the former includes a plurality of first patterns 702_2 spaced apart from one another in the first direction DR1.

In some embodiments, the display device 10 may include a plurality of first patterns 720_1 in the line area LA. The plurality of first patterns 720_1 may be on the third area 620 of the third contact electrode 610. The plurality of first patterns 720_1 may be on the third area 620 of the third contact electrode 610 such that they are spaced apart from one another in the first direction DR1. Although the first patterns 720_1 are arranged in the first direction DR1, which is the longer side direction of the third area 620 of the third contact electrode 610, as a single row in the drawing, the present disclosure is not limited thereto. The first patterns 720_1 may be arranged in a matrix pattern along the first direction DR1 which is the shorter-side direction of the third area 620 of the third contact electrode 610 and the second direction DR2 which is the longer-side direction of the third area 620 of the third contact electrode 610 on the third area 620 of the third contact electrode 610.

The length of the first pattern 720_2 in the first direction DR1 may be smaller than the length of the third area 620 of the third contact electrode 610 in the first direction DR1. The length of the first pattern 720_1 in the second direction DR2 may be larger than the length of the third area 620 of the third contact electrode 610 in the second direction DR2. The third area 620 of the third contact electrode 610 may be exposed in the third direction DR3 in the space between the first patterns 720_2 adjacent to each other in the first direction DR1. The fourth insulating layer 540 may be on a surface of the third area 620 of the third contact electrode 610 where the first pattern 720_2 is not provided. According to this exemplary embodiment of the present disclosure, the first pattern 720_2 is formed by patterning it only on the third area 620 of the third contact electrode 610, such that the material cost can be saved or reduced.

Figure 23:
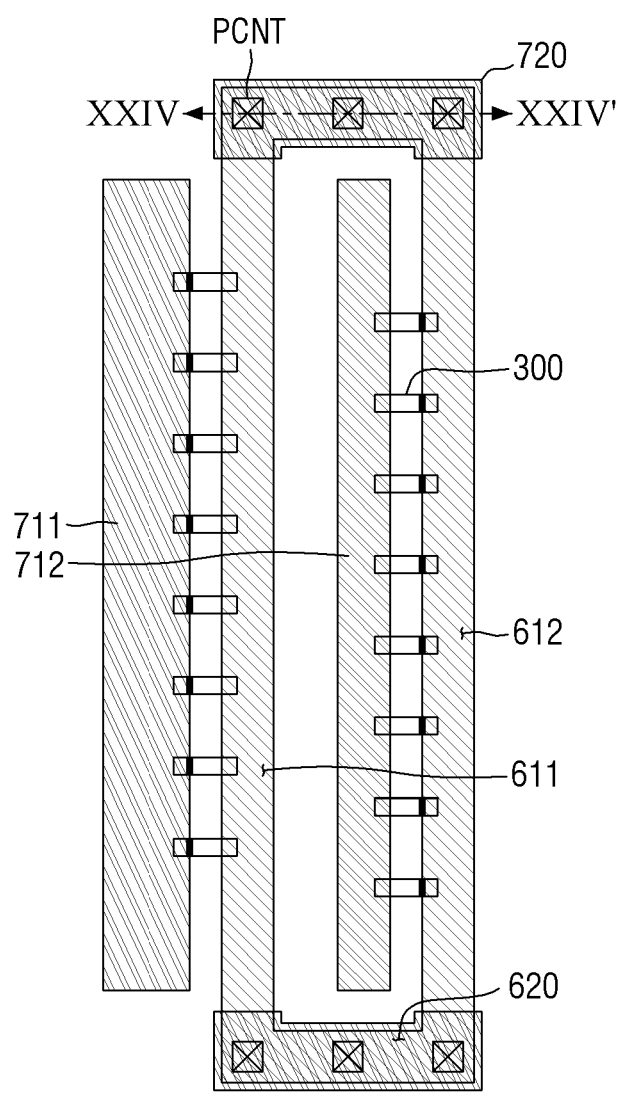
FIG. 23 is a plan view showing a layout for illustrating relative arrangement relationship of light-emitting elements, a plurality of contact electrodes, and a first pattern according to yet another exemplary embodiment.
Figure 24:
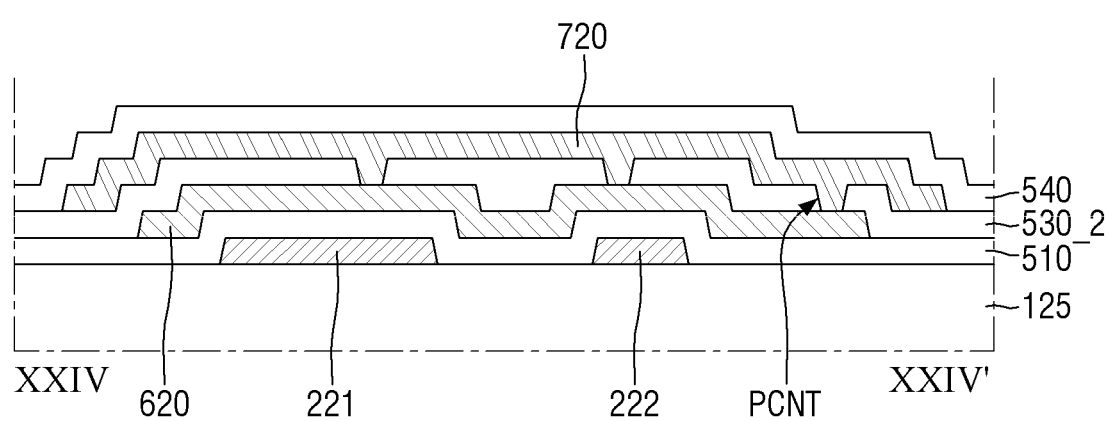
FIG. 24 is a cross-sectional view of a display device, taken along line XXIV-XXIV' of FIG. 23.

FIG. 23 is a plan view showing a layout for illustrating relative arrangement relationships of light-emitting elements, a plurality of contact electrodes, and a first pattern according to yet another exemplary embodiment. FIG. 24 is a cross-sectional view of a display device, taken along line XXIV-XXIV' of FIG. 23.

A display device 10 according to the exemplary embodiment of FIGS. 23 and 24 is different from the display device according to the exemplary embodiment of FIGS. 3 and 4 in that a third insulating layer 530_2 is between a third contact electrode 610 and a first pattern 720 in the line area LA.

For example, referring to FIGS. 23 and 24 in conjunction with FIGS. 4 and 16, the third insulating layer 530_2 is entirely on the substrate 110, and at least a part of the first electrode 211 and the second electrode 222 may be exposed in the contact area CA. In addition, the third insulating layer 530_2 may be on the third area 620 of the third contact electrode 610 in the line area LA, and may include a plurality of contact holes PCNT that penetrate through the third insulating layer 530_2. A plurality of contact holes PCNT formed in the third insulating layer 530_2 in the line area LA may expose a part of the upper surface of the third area 620 of the third contact electrode 610 thereunder in the third direction DR3.

In the line area LA, the first pattern 720 may be on the third insulating layer 530_2. For example, the first pattern 720 may be on the third insulating layer 530_2 in the line area LA, and may be in contact (e.g., physical contact) with the third area 620 of the third contact electrode 610 through a plurality of contact holes PCNT that penetrate the third insulating layer 530_2. The lower surface of the first pattern 720 overlapping the plurality of contact holes PCNT in the line area LA may be in direct contact (e.g., physical contact) with the upper surface of the third area 620 of the third contact electrode 610. The lower surface of the first pattern 720 not overlapping the plurality of contact holes PCNT in the line area LA may be in direct contact (e.g., physical contact) with the upper surface of the third insulating layer 530_2.

According to the exemplary embodiment of the present disclosure, during the fabricating process of forming the third insulating layer 530_2 on the substrate 110, the third insulating layer 530_2 may be formed such that the first opening OP1 exposing the first electrode 211 and the other end of the first light-emitting element 300 and the second opening OP2 exposing the second electrode 222 and the other end of the second light-emitting element 300 are formed in the contact area CA, whereas the third opening OP3 (see FIG. 16) in the line area LA is not formed. The third insulating layer 530_2 is also in the line area LA, and the first pattern 720 is in contact (e.g., physical contact) with the third area 620 of the third contact electrode 610 through the plurality of contact holes that penetrate through the third insulating layer 530_2, so that the overall area of the conductive layer in the line area LA can be increased and accordingly the overall resistance can be reduced.

In addition, according to the exemplary embodiment of the present disclosure, the third insulating layer 530 is on the third area 620 of the third contact electrode 610 in the line area LA, and thus, it is possible to prevent or reduce damage to the third area 620 of the third contact electrode 610 by the etchant used during the etching process for forming the first and second contact electrodes 711 and 712 on it even when the third contact electrode 610 and the first and second contact electrodes 711 and 712 include the same (e.g., substantially the same) material.

Figure 25:
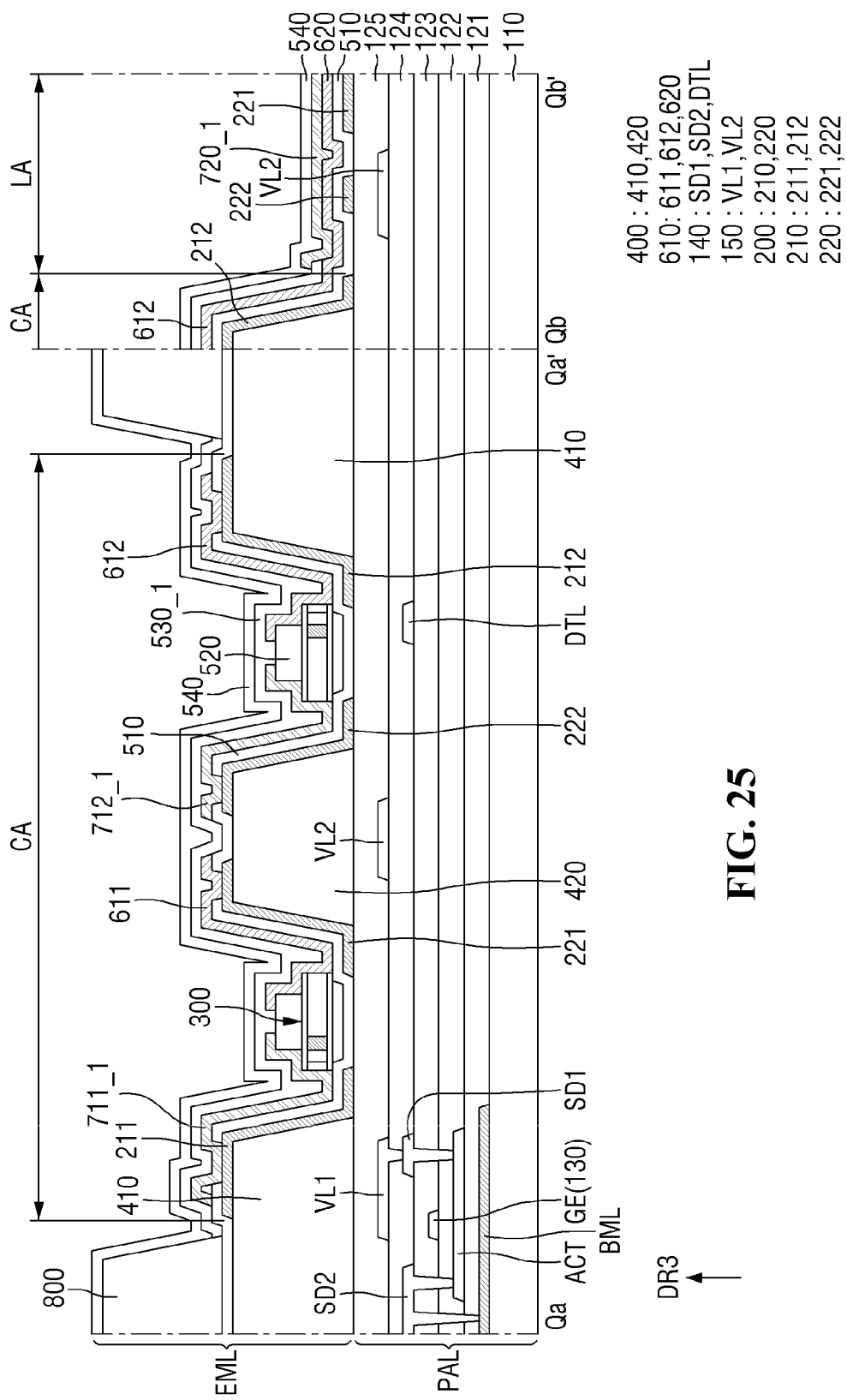
FIG. 25 is a cross-sectional view showing another example of a display device, taken along lines Qa-Qa' and Qb-Qb' of FIGS. 2 and 3.

FIG. 25 is a cross-sectional view showing another example of a display device, taken along lines Qa-Qa' and Qb-Qb' of FIGS. 2 and 3.

The exemplary embodiment of FIG. 25 is different from the exemplary embodiment of FIG. 4 in that first and second contact electrodes 711_1 and 712_1 and a third contact electrode 610 are formed on the same layer.

In some embodiments, the first and second contact electrodes 711_1 and 712_1 may be formed on the same layer as the third contact electrode 610. As the first and second contact electrodes 711_1 and 712_1 are formed on the same layer as the third contact electrode 610, the third insulating layer 530_1 may be on the first to third contact electrodes 711_1, 712_1, and 610. Accordingly, a part of the first and second contact electrodes 711_1 and 712_1 may be directly on the second insulating layer 520 in the contact area CA. The first contact electrode 711_1 and the first area 611 of the third contact electrode 610 may be spaced apart from one another on the second insulating layer 520. Likewise, the second contact electrode 712_1 and the second area 612 of the third contact electrode 610 may be spaced apart from each other on the second insulating layer 520.

The third insulating layer 530_1 may expose at least a part of the third area 620 of the third contact electrode 610 in the line area LA. The third insulating layer 530_1 may not overlap in the third direction DR3 with the third area 620 of the third contact electrode 610. The first pattern 720_1 may be in contact (e.g., physical contact) with the third area 620 of the third contact electrode 610 exposed by the third insulating layer 530_1.

The first and second contact electrodes 711_1 and 712_1 and the third contact electrode 610 may be formed together via a patterning process. As the first and second contact electrodes 711_1 and 712_1 are formed together with the third contact electrode 610, the first pattern 720_1 may be formed via a subsequent process after the first to third contact electrodes 711_1, 712_1 and 610 have been formed.

When the first pattern 720_1 is formed via a subsequent process after the first to third contact electrodes 711_1, 712_1 and 610 have been formed, the third insulating layer 530_1 is on the first to third contact electrodes 711_1, 712_1 and 610 to cover the first to third contact electrodes 711_1, 712_1 and 610. Accordingly, it is possible to prevent or reduce damage to the first to third contact electrodes 711_1, 712_1 and 610 by the etchant used to etch the material included in the first pattern 720_1 during the etching process of forming the first pattern 720_1.

In an exemplary embodiment, the first to third contact electrodes 711, 712, and 610 may include crystalline ITO, and the first pattern 720_1 may include amorphous ITO and/or crystalline ITO. As described above, because the first to third contact electrodes 711, 712 and 610 include the crystalline ITO, it is possible to prevent or reduce damage to the third area 620 of the third contact electrode 610 by the etchant for etching the material included by the first pattern 720 even though the third area 620 of the third contact electrode 610 is exposed by the third insulating layer 530_1.

In concluding the detailed description, those skilled in the art will appreciate that many variations and modifications can be made to the example embodiments without substantially departing from the principles of the present disclosure. Therefore, the disclosed embodiments of the present disclosure are used in a generic and descriptive sense only and not for purposes of limitation.

What is claimed is:

1. A method of fabricating a display device, the method comprising:
    forming an electrode layer comprising a first electrode layer and a second electrode layer spaced apart from each other on a target substrate comprising a line area and a contact area, and providing a plurality of light-emitting elements between the first electrode layer and the second electrode layer in the contact area;
    forming a contact electrode material pattern on the electrode layer;
    forming a contact electrode by carrying out heat treatment on the contact electrode material pattern; and
    forming a first pattern on the contact electrode in the line area,
    wherein the first pattern comprises a conductive material and is in contact with a portion of the contact electrode is not in the contact area.

2. The method of claim 1, wherein the forming the contact electrode comprises forming the contact electrode comprising crystalline indium tin oxide (ITO) by carrying out heat treatment on the contact electrode material pattern comprising amorphous ITO, and
    wherein the heat treatment is carried out at a temperature of 200° C. to 270° C. for 10 to 20 minutes.

3. The method of claim 1, further comprising forming an insulating layer on the contact electrode prior to the forming the first pattern,
    wherein the insulating layer exposes at least a part of the contact electrode in the line area, and
    wherein the first pattern is on the contact electrode exposed by the insulating layer.

4. The method of claim 1, wherein the first electrode layer comprises a first electrode and a first electrode pattern spaced apart from the first electrode,
    wherein the second electrode layer comprises a second electrode between the first electrode and the first electrode pattern, and a second electrode pattern between the first electrode and the second electrode, wherein the contact electrode comprises a first area on the second electrode pattern in the contact area, a second area on the first electrode pattern in the contact area, and a third area between the first area and the second area in the line area, and wherein the first pattern is on the third area.

* * * * *